(12) United States Patent
Fukunaka et al.

(10) Patent No.: US 9,638,576 B2
(45) Date of Patent: May 2, 2017

(54) INFRARED-SENSOR FILTER MEMBER, MANUFACTURING METHOD THEREOF, INFRARED SENSOR, AND MANUFACTURING METHOD THEREOF

(71) Applicant: ASAHI KASEI MICRODEVICES CORPORATION, Tokyo (JP)

(72) Inventors: Toshiaki Fukunaka, Tokyo (JP); Edson Gomes Camargo, Tokyo (JP); Sosuke Nishida, Tokyo (JP); Yuta Takagi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/763,890

(22) PCT Filed: Feb. 6, 2014

(86) PCT No.: PCT/JP2014/000638
§ 371 (c)(1),
(2) Date: Jul. 28, 2015

(87) PCT Pub. No.: WO2014/125800
PCT Pub. Date: Aug. 21, 2014

(65) Prior Publication Data
US 2015/0362365 A1 Dec. 17, 2015

(30) Foreign Application Priority Data

Feb. 14, 2013 (JP) ................................. 2013-026760

(51) Int. Cl.
*G01J 3/12* (2006.01)
*H01L 31/0232* (2014.01)
(Continued)

(52) U.S. Cl.
CPC ............... *G01J 3/12* (2013.01); *G01J 1/0403* (2013.01); *G01J 1/0407* (2013.01);
(Continued)

(58) Field of Classification Search
CPC .......... G01J 3/12; G01J 1/0403; G01J 1/0407
See application file for complete search history.

(56) References Cited

U.S. PATENT DOCUMENTS 4,967,081 A 10/1990 Quad et al.
5,041,723 A 8/1991 Ishida et al.
(Continued)

FOREIGN PATENT DOCUMENTS

EP 1 239 270 A1 9/2002
EP 2 284 904 A1 2/2011
(Continued)

OTHER PUBLICATIONS

International Preliminary Report on Patentability dated Aug. 18, 2015, for the corresponding International application No. PCT/JP2014/000638.

(Continued)

*Primary Examiner* — Casey Bryant
(74) *Attorney, Agent, or Firm* — Morgan, Lewis & Bockius LLP

(57) ABSTRACT

An infrared-sensor filter member includes an optical filter disposed in an opening portion of a second member and a first member. The infrared-sensor filter member includes a recess portion formed from a light-incident surface of the optical filter and the first member. At least a part of a bottom surface of the recess portion is formed by the light-incident surface and side walls of the recess portion, which are formed by the first member.

14 Claims, 23 Drawing Sheets

(51) Int. Cl.
*H01L 31/09* (2006.01)
*G01J 1/04* (2006.01)
*G01J 5/04* (2006.01)
*G01J 5/08* (2006.01)
*G01J 5/02* (2006.01)
*G01J 3/28* (2006.01)
*G02B 3/00* (2006.01)

(52) U.S. Cl.
CPC ............... *G01J 1/0488* (2013.01); *G01J 3/28* (2013.01); *G01J 5/0205* (2013.01); *G01J 5/04* (2013.01); *G01J 5/045* (2013.01); *G01J 5/046* (2013.01); *G01J 5/0803* (2013.01); *G01J 5/0862* (2013.01); *G02B 3/0012* (2013.01); *H01L 31/02325* (2013.01); *H01L 31/09* (2013.01); *G01J 2003/1213* (2013.01); *G01J 2003/1282* (2013.01)

(56) References Cited

U.S. PATENT DOCUMENTS

| | | |
|---|---|---|
| 2002/0122314 A1 | 9/2002 | Kojima et al. |
| 2008/0061237 A1 | 3/2008 | Franz et al. |
| 2010/0055833 A1 | 3/2010 | Uchida et al. |
| 2011/0090505 A1 | 4/2011 | Kuze et al. |

FOREIGN PATENT DOCUMENTS

| | | |
|---|---|---|
| JP | 09-15040 A | 1/1997 |
| JP | 2001-050818 A | 2/2001 |
| JP | 2003-254821 A | 9/2003 |
| JP | 2007-067092 A | 3/2007 |
| JP | 2008-505331 A | 2/2008 |
| JP | 2010-062232 A | 3/2010 |
| JP | 2012-112728 A | 6/2012 |
| JP | 2012-199311 A | 10/2012 |
| JP | 2012-215431 A | 11/2012 |
| JP | 2012-215445 A | 11/2012 |
| WO | 2009/148134 A1 | 12/2009 |

OTHER PUBLICATIONS

Partial supplementary European Search Report dated Sep. 30, 2016, for corresponding European Patent Application No. 14752060.5.
Extended European Search Report dated Jan. 18, 2017, for corresponding European Patent Application No. 14752060.5.
International Search Report dated Mar. 11, 2014 for International application No. PCT/JP2014/000638.

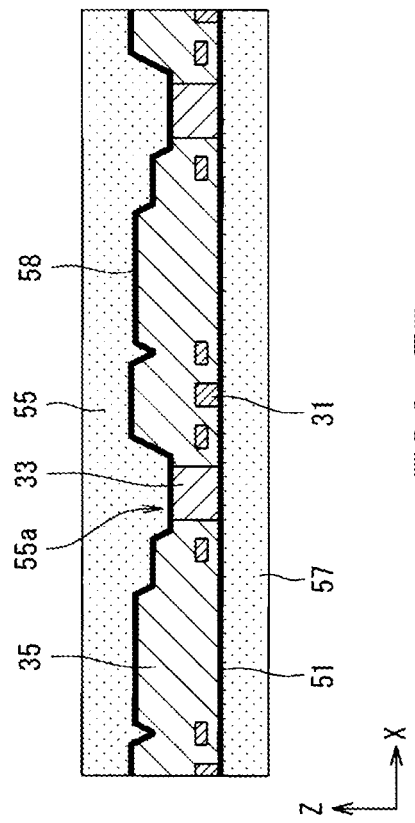
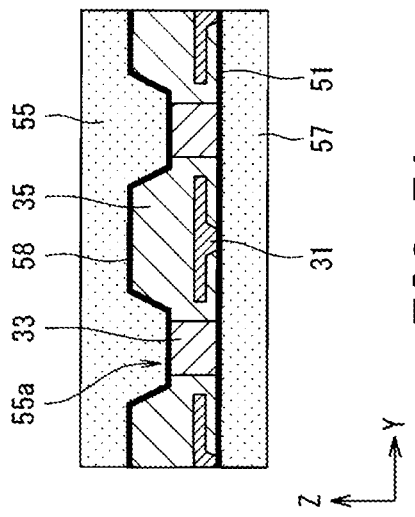
FIG. 7B
FIG. 7A

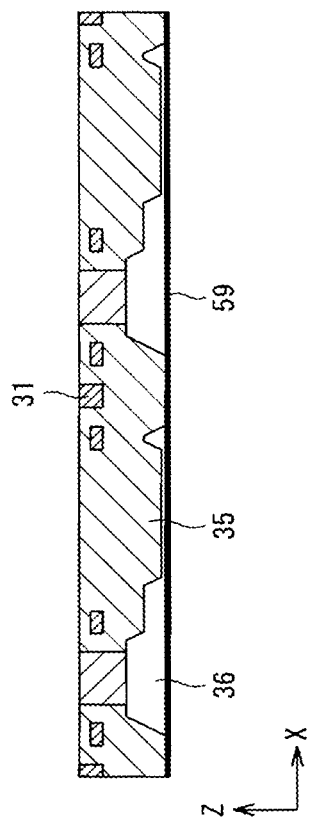
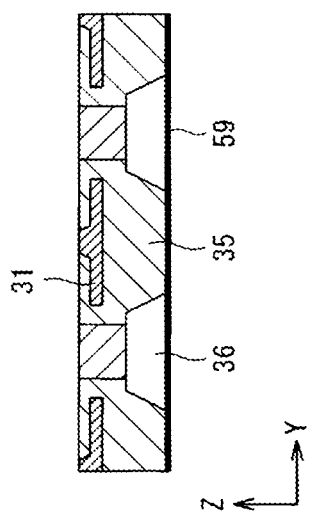

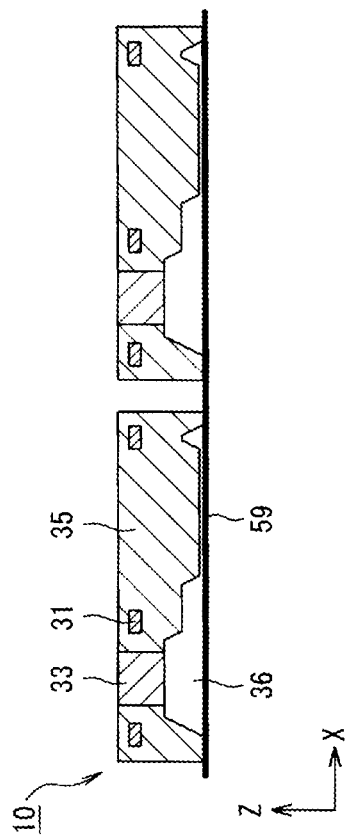
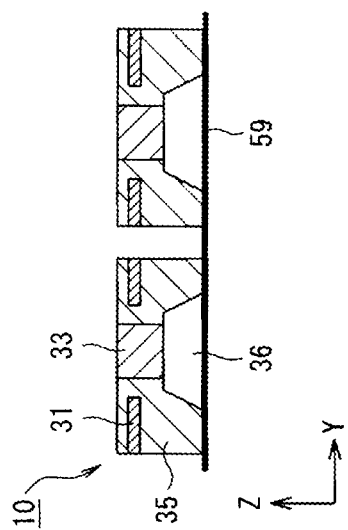

FIG. 11A
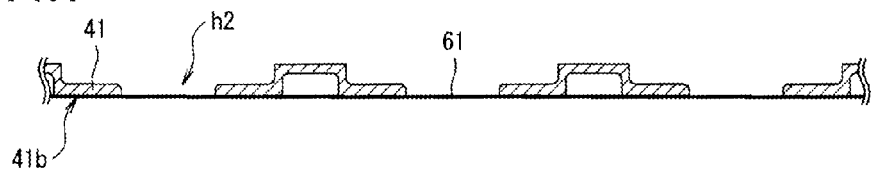
FIG. 11B
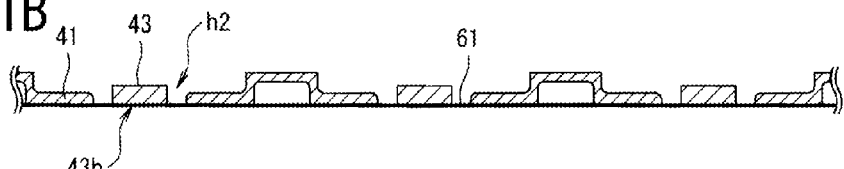
FIG. 11C
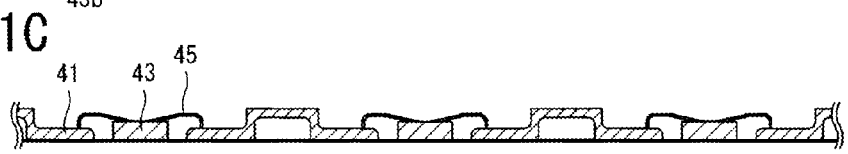
FIG. 11D
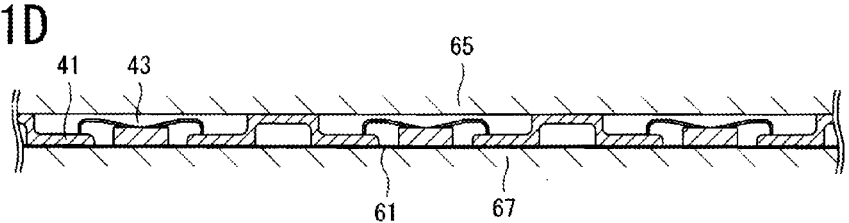
FIG. 11E
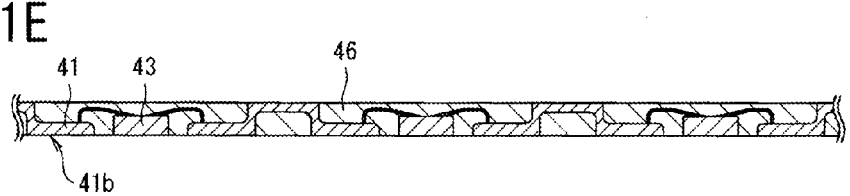
FIG. 11F
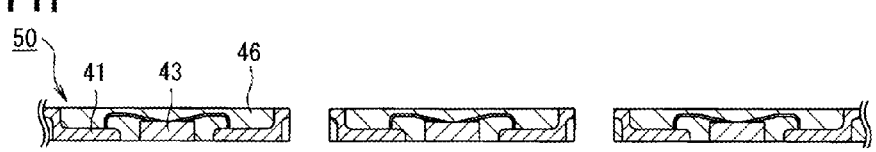
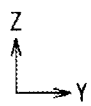

INFRARED-SENSOR FILTER MEMBER, MANUFACTURING METHOD THEREOF, INFRARED SENSOR, AND MANUFACTURING METHOD THEREOF

TECHNICAL FIELD

The present disclosure relates to an infrared-sensor filter member, a manufacturing method thereof, an infrared sensor, and a manufacturing method thereof.

BACKGROUND ART

It has been thus far known that, when detecting a predetermined infrared ray using an infrared sensor element, a wavelength selective filter that selectively transmits a light having a specific wavelength to a sensor element is used. For example, FIGS. 2B and 6 in PTL 1 illustrate a configuration in which an optical filter is attached to an infrared sensor element via a holding member.

CITATION LIST

Patent Literature

PTL 1: WO 2009/148134

SUMMARY OF INVENTION

According to an aspect of the present disclosure, there is provided an infrared-sensor filter member including: an optical filter for an infrared sensor; and a recess portion formed of one surface of the optical filter and a first member, wherein at least a part of a bottom surface of the recess portion is formed of the one surface of the optical filter, and a side wall of the recess portion is formed of the first member.

According to another embodiment of the present disclosure, there is provided a manufacturing method of an infrared-sensor filter member, such manufacturing method including: preparing by sandwiching an optical filter, for an infrared sensor, between a first mold and a protrusion portion of a second mold; and filling a space between the first mold and the second mold with a first member.

According to another embodiment of the present disclosure, there is provided a manufacturing method of an infrared-sensor filter member including: preparing by sandwiching an optical filter for an infrared sensor between a first mold and a second mold; filling a space between the first mold and the second mold with a molded member; and fixing a first member to a member obtained by removing the first mold and the second mold from the member to form a recess portion, wherein at least a part of a bottom surface of the recess portion is formed of one surface of the optical filter, and a side wall of the recess portion is formed of the first member.

BRIEF DESCRIPTION OF DRAWINGS

FIGS. 7A and 7B are views illustrative of the manufacturing method of the infrared-sensor filter member 10;
FIGS. 9A and 9B are views illustrative of the manufacturing method of the infrared-sensor filter member 10;
FIGS. 10A and 10B are views illustrative of the manufacturing method of the infrared-sensor filter member 10;
FIGS. 11A to 11F are views illustrative of the manufacturing method of an infrared sensor member 50.

DESCRIPTION OF EMBODIMENTS

Figure 1A:
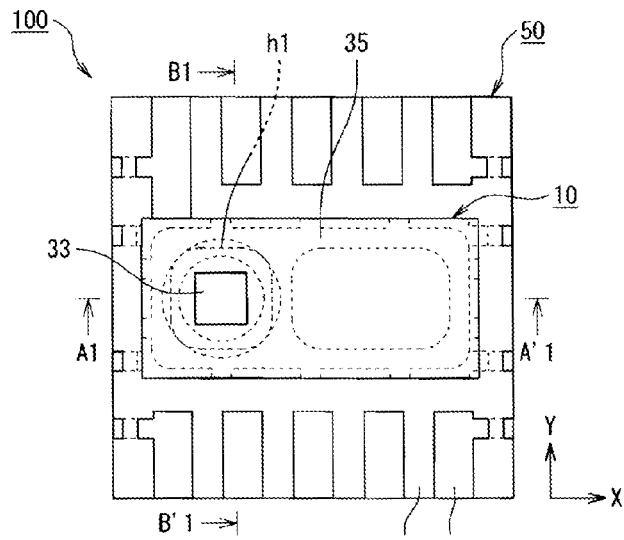
FIGS. 1A to 1D are views illustrative of a configuration example of an infrared sensor 100 according to the first embodiment.

In a case where the optical filter and a holder are fixed to each other by using an adhesive in PTL 1, each of the opposing surfaces of the optical filter and the holder is a flat surface with no unevenness. Then, the flat surfaces are adhered together via the adhesive. Therefore, there is a possibility that the adhesive may leak and spread out during adhesion and come into contact with the optical filters, and the optical filters may be contaminated.

Thus, the present disclosure has been made in consideration of the above-described circumstances, and the purpose of the present disclosure is to provide an infrared-sensor filter member, a manufacturing method thereof, an infrared sensor, and a manufacturing method thereof which are capable of preventing the optical filter from being contaminated by the adhesive.

In order to solve the above-described problems, according to an aspect of the present disclosure, there is provided an infrared-sensor filter member including: an optical filter for an infrared sensor; and a recess portion formed of one surface of the optical filter and a first member, wherein at least a part of a bottom surface of the recess portion is formed of the one surface of the optical filter, and a side wall of the recess portion is formed of the first member.

Furthermore, in the infrared-sensor filter member, an inner side surface of the side wall may be inclined relative to the bottom surface such that an area of an opening surface of the recess portion is larger than an area of the bottom surface of the recess portion.

Furthermore, the infrared-sensor filter member may further include a second member with an emissivity equal to or smaller than 0.3, wherein at least a part of the second member may be exposed from an outer surface of the infrared-sensor filter member.

Furthermore, in the infrared-sensor filter member, the other surface of the optical filter may be exposed from one of outer surfaces of the infrared-sensor filter member, and at least a part of the second member may be exposed from the one of the outer surfaces of the infrared-sensor filter member.

Furthermore, in the infrared-sensor filter member, at least a part of the second member may be exposed from the outer surface of the infrared-sensor filter member to surround the other surface of the optical filter in a plan view.

Furthermore, in the infrared-sensor filter member, at least a part of the second member may be exposed from an outer side surface of the infrared-sensor filter member.

Furthermore, in the infrared-sensor filter member, the emissivity of the first member may be equal to or larger than 0.7.

Furthermore, in the infrared-sensor filter member, the emissivity of the first member may be equal to or smaller than 0.3.

Furthermore, in the infrared-sensor filter member, an inner side surface of the side wall of the recess portion may be subjected to blackening treatment.

According to another embodiment of the present disclosure, there is provided an infrared sensor, including: the infrared-sensor filter member described above; an infrared sensor member including an infrared sensor element; and a connecting member adopted to connect the infrared-sensor filter member to the infrared sensor member, wherein the infrared-sensor filter member is disposed on the infrared sensor member such that the recess portion covers the light receiving surface of the infrared sensor element.

Furthermore, in the infrared sensor, the infrared sensor member may further include: a third member with an emissivity equal to or smaller than 0.3; and a molded member adopted to seal the infrared sensor element and the third member, and the infrared-sensor filter member may be disposed on one of outer surfaces of the infrared sensor member, and at least a part of the third member may be exposed from the one of the outer surfaces of the infrared sensor member.

Furthermore, in the infrared sensor, at least a part of the third member may be exposed from the one of the outer surfaces of the infrared sensor member in a region outside the infrared-sensor filter member in a plan view.

Furthermore, in the infrared sensor, the light receiving surface of the infrared sensor element may be exposed from one of the outer surfaces of the infrared sensor member, and the light receiving surface of the infrared sensor element may be surrounded by a member with an emissivity equal to or larger than 0.7 on the one of the outer surfaces of the infrared sensor member.

According to another embodiment of the present disclosure, there is provided a manufacturing method of an infrared-sensor filter member, such manufacturing method including: preparing by sandwiching an optical filter, for an infrared sensor, between a first mold and a protrusion portion of a second mold; and filling a space between the first mold and the second mold with a first member.

Furthermore, in the manufacturing method of the infrared-sensor filter member, the preparing may include: disposing a second member with an emissivity equal to or smaller than 0.3 on the first mold, an opening portion being formed on the second member; and disposing the optical filter in the opening portion of the second member.

Furthermore, in the manufacturing method of the infrared-sensor filter member, the preparing may include: disposing a pressure-sensitive adhesive sheet on the first mold; disposing a second member with an emissivity equal to or smaller than 0.3 on an adhesive surface of the pressure-sensitive adhesive sheet, an opening portion being formed on the second member; disposing the optical filter in the opening portion of the second member and attaching the optical filter to the adhesive surface of the pressure-sensitive adhesive sheet; and disposing the second mold, via a fluororesin sheet, on aside of the optical filter that is not attached to the pressure-sensitive adhesive sheet, and the filling may include: filling the first member into a space between the fluororesin sheet and the pressure-sensitive adhesive sheet, the space being sandwiched by the first mold and the second mold; and removing the fluororesin sheet and the pressure-sensitive adhesive sheet.

Furthermore, in a manufacturing method of an infrared-sensor filter member may include preparing by sandwiching an optical filter for an infrared sensor between a first mold and a second mold; filling a space between the first mold and the second mold with a molded member; and fixing a first member to a member obtained by removing the first mold and the second mold from the member to forma recess portion, wherein at least a part of a bottom surface of the recess portion is formed of one surface of the optical filter, and a side wall of the recess portion is formed of the first member.

Furthermore, in the manufacturing method of the infrared-sensor filter member, the preparing may include disposing a second member with an emissivity equal to or smaller than 0.3 on the first mold, an opening portion being formed on the second member; and disposing the optical filter in the opening portion of the second member.

According to another embodiment of the present disclosure, there is provided a manufacturing method of an infrared sensor, the manufacturing method including: the manufacturing method of the infrared-sensor filter member described above; forming an infrared sensor member including an infrared sensor element; and connecting the infrared-sensor filter member to the infrared sensor element to cover a light receiving surface of the infrared sensor element by a recess portion formed in the infrared-sensor filter member.

Furthermore, in the manufacturing method of the infrared sensor, the forming may include disposing a third member with an emissivity equal to or smaller than 0.3 on a third mold, an opening portion being formed on the third member; disposing the infrared sensor element filter in the opening portion of the third member; sandwiching the infrared sensor element between the third mold and a fourth mold; and filling a molded member into a space between the third mold and the fourth mold, wherein the connecting may include providing a connecting member on a portion of the infrared sensor member from which the third member is exposed.

Hereinafter, embodiments according to the present disclosure will be described with reference to the drawings. It is to be noted that, in the respective drawings described below, to the portions having similar configurations will be given similar reference signs, and description thereof may not be repeated.

First Embodiment (Configuration)
(Configuration of Infrared Sensor)

Figure 1D:
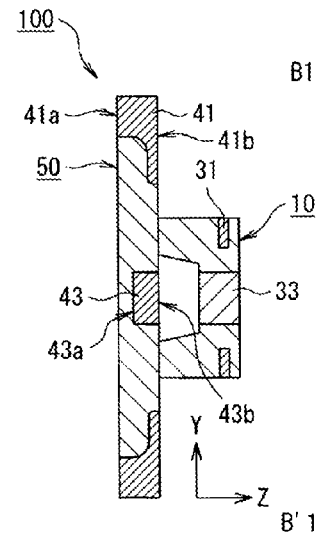
Figure 1B:
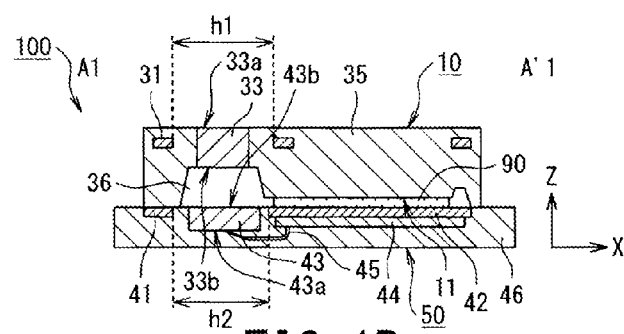
Figure 1C:
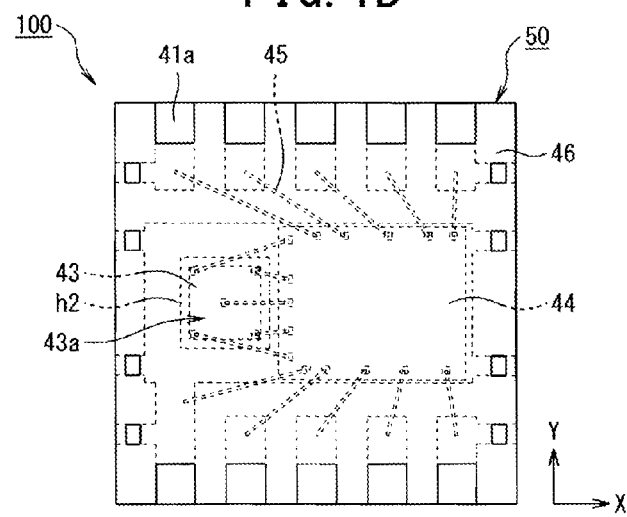

FIGS. 1A to 1D are views illustrative of a configuration example of an infrared sensor 100 according to the first embodiment of the present disclosure. Specifically, FIG. 1A is a plan view, FIG. 1B is a cross-sectional view taken along an A1-A'1 line (that is, a cross-sectional view parallel to an X-Z plane), FIG. 1C is a rear view, and FIG. 1D is a cross-sectional view taken along a B1-B'1 line (that is, a cross-sectional view parallel to a Y-Z plane). The infrared sensor 100 is a sensor device configured to receive an infrared ray (IR) and a device configured to convert the received infrared ray to an electrical signal and to output the electrical signal obtained by the conversion.

As illustrated in FIGS. 1A to 1D, the infrared sensor 100 includes an infrared-sensor filter member 10 and an infrared sensor member 50. The infrared-sensor filter member 10 and the infrared sensor member 50 are adhered together via a connecting member 90. Hereinafter, the infrared-sensor filter member 10 and the infrared sensor member 50 will be described.

(Configuration of Infrared-Sensor Filter Member)

As illustrated in FIGS. 1A to 1D, the infrared-sensor filter member 10 includes the second member 31 on which a penetrating opening portion h1 is formed, an optical filter 33 for the infrared sensor disposed in the opening portion h1 of the second member 31, and a first member 35 configured to cover the second member 31 and the side surfaces of the optical filter 33. In this example, each of a light-exit surface (one surface) 33b of the optical filter 33, a light-incident surface (the other surface) 33a opposite to the light-exit surface 33b, and a part of the second member 31 is exposed from the first member 35. Furthermore, the infrared-sensor filter member 10 is provided with a recess portion 36 formed of the light-exit surface 33b of the optical filter 33 and the first member 35. At least apart of a bottom surface of the recess portion 36 is formed of the light-exit surface 33b of the optical filter 33, and side walls of the recess portion are formed of the first member 35.

From a viewpoint of accurately determining a dose of the infrared ray within a view angle, in one embodiment, the second member 31 is a member with a small emissivity, for example, equal to or smaller than 0.3. The emissivity represents a light energy of heat radiation from an object, as a ratio with a value "1" given as a light energy emitted from a black body having the same temperature as that of the object. The emissivity is 0 or more and 1 or less. An example of a member with a small emissivity is metal. Specifically, examples include copper, silver, gold, platinum, nickel, palladium, and the like. Hereinafter, an example in which a copper lead frame is used as the second member 31 will be described. It is to be noted that the reason why it is possible to accurately determine the dose of the infrared ray within the view angle when the second member 31 is a member with a small emissivity will be described later.

Figure 2A:
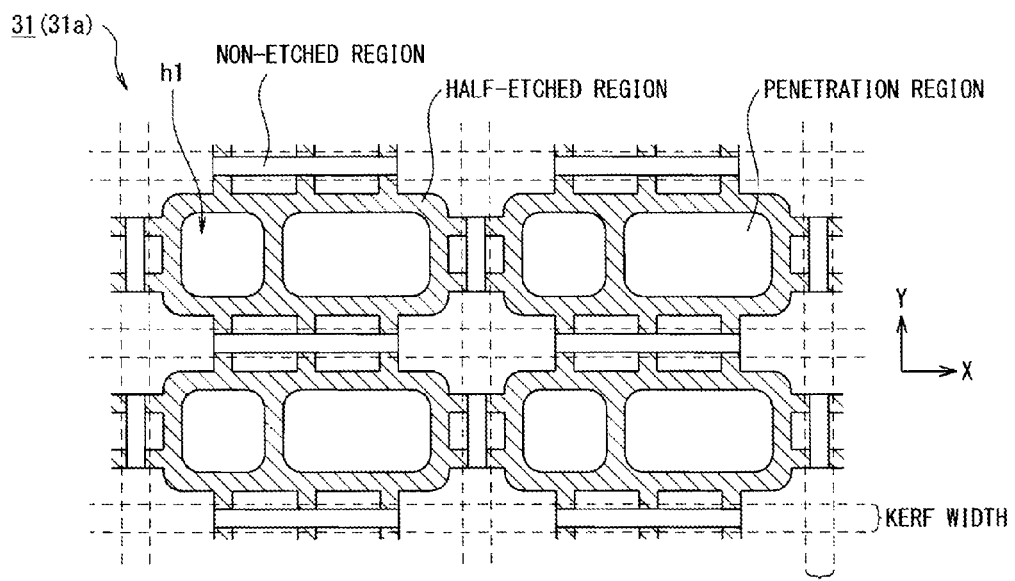
FIGS. 2A and 2B are views illustrative of a configuration example of a lead frame (a second member) 31.
Figure 2B:
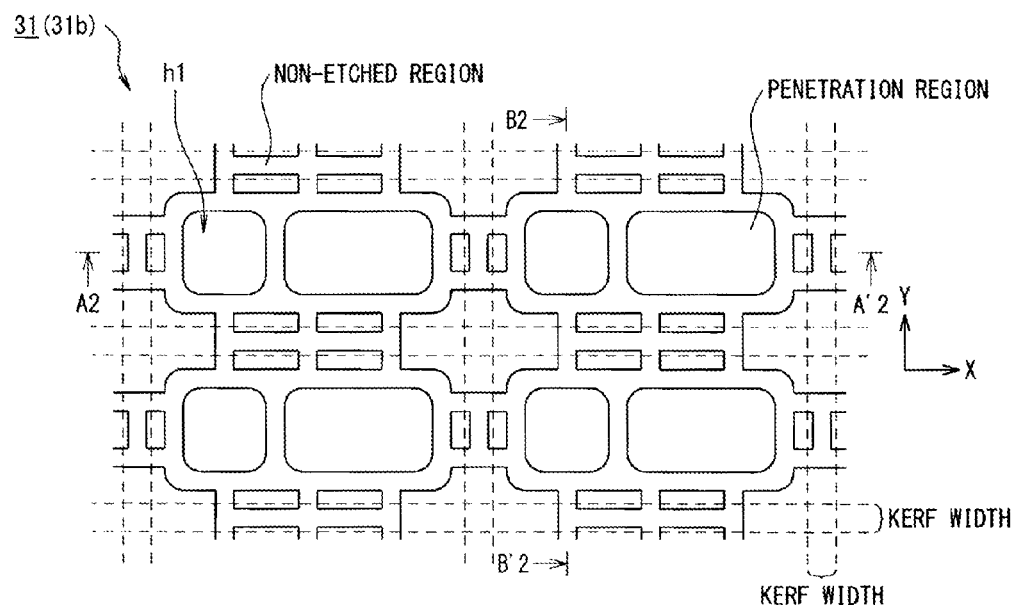

FIGS. 2A and 2B are illustrative views of a configuration example of the lead frame (the second member) 31. Specifically, FIG. 2A is an illustrative plan view of a top surface 31a side of the lead frame 31, and FIG. 2B is an illustrative bottom view of a back surface 31b side of the lead frame 31. The lead frame 31 is formed by selectively etching from each of the top surface 31a side and the back surface 31b side by using a photolithography technique.

As illustrated in FIGS. 2A and 2B, the lead frame 31 has a penetration region including the opening portion h1 formed by etching from each of the top surface 31a side and the back surface 31b side. Furthermore, the lead frame 31 has a region which is half-etched (hereinafter, referred to as a "half-etched region") and a region which is not etched (hereinafter, referred to as a "non-etched region") on the top surface 31a, and has a non-etched region on the back surface 31b. There is no half-etched region on the back surface 31b. The half-etched region is a region covered with the first member 35, and the non-etched region is a region exposed from the first member 35. The thickness of a portion of the lead frame 31 in which neither side is etched is, for example, 0.2 mm.

Returning to FIGS. 1A to 1D, the optical filter 33 has a function to selectively transmit (that is, with a high transmittance) a light within a specific wavelength range. As an example, the optical filter 33 has a function to transmit only infrared rays. As material of optical members making up in the optical filter 33, a material that transmits a preset (that is, "predetermined") infrared ray wavelength range, such as, silicon (Si), glass ($SiO_2$), sapphire ($Al_2O_3$), germanium (Ge), zinc sulfide (ZnS), zinc selenide (ZnSe), calcium fluoride ($CaF_2$), barium fluoride ($BaF_2$), or the like is used. Furthermore, as thin film material evaporated on the optical member, silicon (Si), glass ($SiO_2$), sapphire ($Al_2O_3$), Ge, ZnS, titanium oxide ($TiO_2$), magnesium fluoride ($MgF_2$), silicon dioxide ($SiO_2$), zirconium oxide ($ZrO_2$), tantalum pentoxide ($Ta_2O_5$), or the like is used. Furthermore, a multilayered dielectric filter in which dielectrics having different reflective indices are laminated in a layered form may be formed on the both sides of the optical member so as to have different thicknesses between the top surface and the back surface. The multilayered dielectric filter may be formed only one of the top surface and the back surface. Furthermore, an antireflection coating may be formed on the outermost layer of each or one of the top surface and the back surface in order to prevent unnecessary reflection.

Preferably, the first member 35 is a member tolerant to a high temperature in reflowing. Furthermore, from the viewpoint of accurately determining the dose of the infrared ray within the view angle, in one embodiment, the first member 35 is a member with a large emissivity, for example, equal to or larger than 0.7. Examples of a member with a large emissivity and tolerant to the high temperature during reflowing includes an epoxy-based thermosetting resin, a polyphthalamide resin, a polyphenylene sulfide resin, or a liquid crystal polymer. The package shape and the size of the infrared-sensor filter member 10 may be, for example, a rectangular parallelepiped shape 1.6 mm long, 3.4 mm wide and 0.8 mm thick. It is to be noted that the reason why it is possible to accurately determine the dose of the infrared ray within the view angle when the first member 35 is a member with a large emissivity will be described later.

(Configuration of Infrared Sensor Member)

As illustrated in FIGS. 1A to 1D, the infrared sensor member 50 includes the third member 41 including a penetrating opening portion h2 and a die pad 42, an IR sensor element 43 disposed in the opening portion h2 of the third member 41, a signal processing integrated circuit (IC) 44 attached to one surface side (that is, the top surface 41a side) of the die pad 42, wires 45 made of gold (Au) or the like electrically connecting the IR sensor element 43 and the third member 41, the signal processing IC 44 and the third member 41, and the IR sensor element 43 and the signal processing IC 44, and a molded member 46 covering the third member 41, the IR sensor element 43, the signal processing IC 44 and the wires 45. Each of a light receiving surface (that is, a back surface) 43b of the IR sensor element 43 and a part of the third member 41 is exposed from the molded member 46. For example, a part of the third member 41 is exposed in a surface, of outer surfaces of the infrared sensor member 50, on which the infrared-sensor filter member 10 is disposed. Furthermore, a part of the third member 41 is exposed from an outer surface of the infrared sensor member 50 in a region outside the infrared-sensor filter member 10, in a plan view. Furthermore, the signal processing IC 44 and the top surface 43a and the side surfaces of the IR sensor element 43 are covered with the molded member 46.

From the viewpoint of accurately determining the dose of the infrared ray within the view angle, in one embodiment, the third member 41 is a member with a small emissivity, for example, equal to or smaller than 0.3. An example of a member with a small emissivity is metal. Specifically, examples include copper, silver, gold, platinum, nickel, palladium, and the like. Hereinafter, an example in which a copper lead frame is used as the third member 41 (including the die pad 42) will be described. It is to be noted that the reason why it is possible to accurately determine the dose of the infrared ray within the view angle when the third member 41 is a member with a small emissivity will be described later.

Figure 3A:
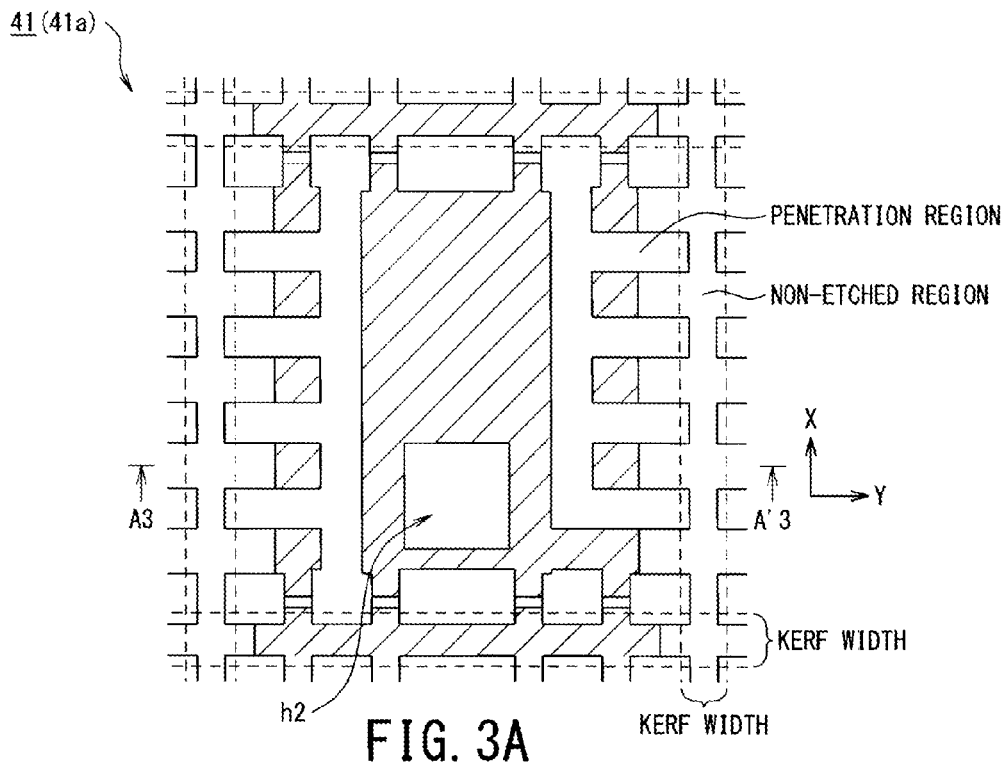
FIGS. 3A and 3B are views illustrative of a configuration example of a lead frame (a third member) 41.
Figure 3B:
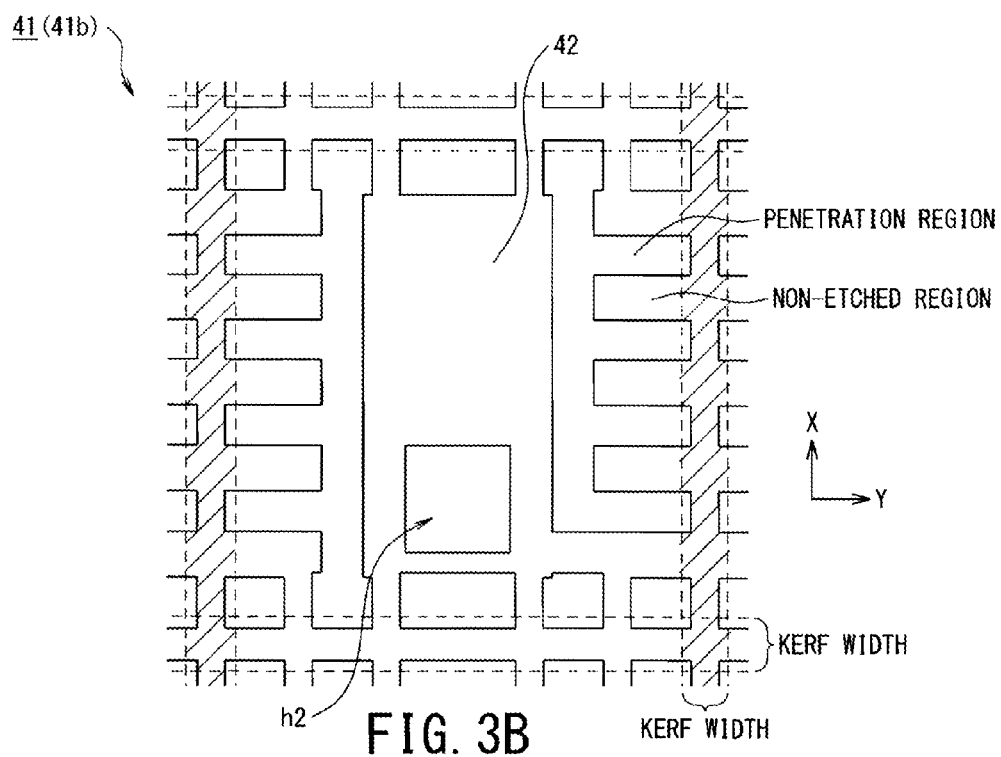

FIGS. 3A and 3B are views illustrative of a configuration example of the lead frame (the third member) 41. Specifically, FIG. 3A is a plan view illustrative of the top surface 41a side of the lead frame 41, and FIG. 3B is a bottom view illustrative of a back surface 41b side of the lead frame 41. The lead frame 41 is formed by selectively etching from each of the top surface 41a side and the back surface 41b side by using the photolithography technique and by performing a plating treatment of nickel (Ni)-palladium (Pd)-gold (Au) or the like.

As illustrated in FIGS. 3A and 3B, the lead frame 41 has a penetration region including the opening portion h2 formed by etching from each of the top surface 41a side and the back surface 41b side. Furthermore, the lead frame 41 has a half-etched region a non-etched region on the top surface 41a, and similarly has a half-etched region and a non-etched region on the back surface 41b, for example. The shaded areas in FIGS. 3A and 3B represent the half-etched regions. It is to be noted that the half-etched regions are covered with the molded member 46 and the non-etched regions is exposed from the molded member 46. The thickness of a portion of the lead frame 41 in which neither side is etched (corresponding to a thickness of the infrared sensor member, described later) is, for example, 0.4 mm.

Figure 4A:
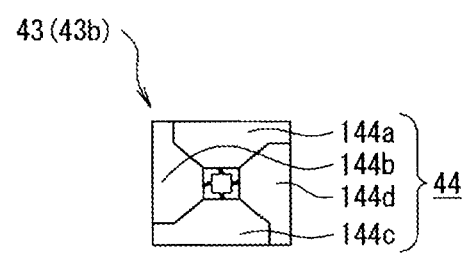
FIGS. 4A and 4B are views illustrative of a configuration example of an IR sensor element 43.
Figure 4B:
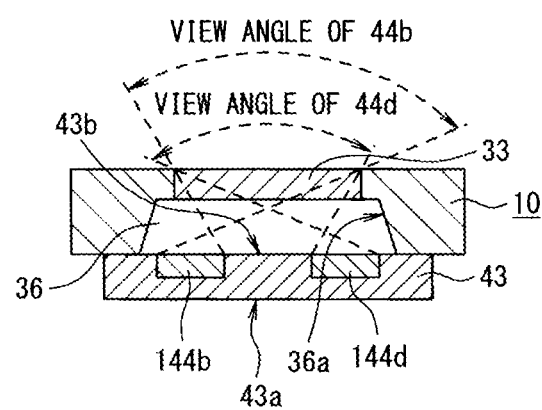

FIGS. 4A and 4B are a plan view illustrative of a configuration example of the IR sensor element 43 and a cross-sectional view schematically illustrating a positional relationship between a light receiving portion of the IR sensor element 43 and the infrared-sensor filter member, respectively. The IR sensor element 43 is a sensor element configured to detect an infrared ray. As illustrated in FIG. 4A, the IR sensor element 43 includes a light transmission substrate transmitting the infrared ray and a light receiving portion 144 formed on the back surface side of the light transmission substrate. A gallium arsenide (GaAs) substrate is used as the light transmission substrate. Furthermore, a semiconductor substrate of Si, indium arsenide (InAs), indium phosphide (InP), gallium phosphide (GaP), Ge, or the like, a substrate of gallium nitride (GaN) or aluminum nitride (AlN), a sapphire substrate, a glass substrate, or the like may be used instead of the GaAs substrate. By using such a substrate as the light transmission substrate, it is possible to effectively transmit a light having a specific wavelength from the back surface 43b to the top surface 43a of the IR sensor element 43.

The IR sensor element 43 is configured to output a signal depending on an incident infrared ray. The signal may be output as either a current output or a voltage output.

The IR sensor element 43 includes an IR sensor element configured to output a signal depending on an absolute amount of temperature within the view angle and an IR sensor element configured to output a signal depending on an amount of change of the temperature within the view angle. An example of the former includes a quantum type infrared sensor element and an example of the latter includes a pyroelectric infrared sensor element. The IR sensor element configured to output the signal depending on the absolute amount of the temperature within the view angle outputs more information than that output from the IR sensor element configured to output the signal depending on the amount of change of the temperature within the view angle. Thus, the IR sensor element configured to output the signal depending on the absolute amount of the temperature within the view angle is preferably used.

An example of a specific configuration of the quantum type infrared sensor element includes a configuration having a semiconductor layered portion having a PN or PIN junction. A specific example of the semiconductor layered portion having the PN or PIN junction includes a semiconductor layered portion using a compound semiconductor layer including indium and antimony. From the viewpoint of being enabled to operate at room temperature without a cooling mechanism, in one embodiment, a barrier layer with a large bandgap is provided at a part of the semiconductor layered portion. An example of the barrier layer with a large bandgap includes an aluminium indium antimonide (AlInSb).

Furthermore, the light receiving portion 144 includes four light receiving regions 144a to 144d, which are, for example, divided into upper, lower, right, and left regions in a plan view. As illustrated in FIG. 4B, the light receiving portion 144 faces the optical filter 33 via a space in the recess portion 36, and each of the light receiving regions 144a to 144d is capable of receiving an infrared ray passing through the optical filter 33.

It is to be noted that the positions of the light receiving regions 144a to 144d are different from one another in a plan view, as illustrated in FIG. 4A. Furthermore, as illustrated in FIG. 4B, the view angle (that is, a range in which the IR can enter) of each of the light receiving regions 144a to 144d is restricted by inner side surfaces 36a of the recess portion 36 and the side surfaces of the optical filter 33.

Returning to FIGS. 1A to 1D, the molded member 46 is made of an epoxy-based thermosetting resin, for example, to be tolerant to the high temperature in reflowing. The outer shape and the size of the molded member 46, that is, the package shape and the size of the infrared sensor member 50 are, for example, a rectangular parallelepiped shape 4.0 mm long, 4.0 mm wide and 0.4 mm thick.

(Manufacturing Method)

A manufacturing step of the infrared sensor 100 includes a manufacturing step of the infrared-sensor filter member 10, a manufacturing step of the infrared sensor member 50, and a step for connecting the infrared sensor member 50 and the infrared-sensor filter member 10 by the connecting member. The infrared-sensor filter member 10 is connected on the infrared sensor member 50 via the connecting member 90 such that the recess portion 36 covers the light receiving surface of the IR sensor element 43. The connecting member 90 may be an adhesive or a pressure-sensitive adhesive. Examples of the connecting member 90 include an insulating paste (for example, a thermosetting epoxy resin).

The manufacturing step of the infrared-sensor filter member 10 is performed in series with or in parallel to the manufacturing step of the infrared sensor member 50. Herein, the manufacturing step of the infrared-sensor filter member 10 will be described first. Then, the manufacturing step of the infrared sensor member 50 will be described. And then, the connecting method of the both members will be described.

(Manufacturing Method of Infrared-Sensor Filter Member)

FIGS. 5A to 10B are cross-sectional views illustrative of the manufacturing method of the infrared-sensor filter member 10 in order of process sequence. Herein, each step will be described by using cross-sectional surfaces of the lead frame (the second member) 31 or the like taken along the B2-B'2 line and the A2-A'2 line illustrated in FIG. 2B.

Figure 5B:
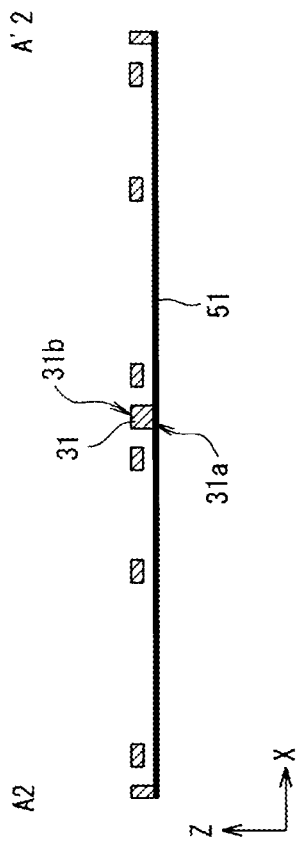
FIGS. 5A and 5B are views illustrative of a manufacturing method of an infrared-sensor filter member 10.
Figure 5A:
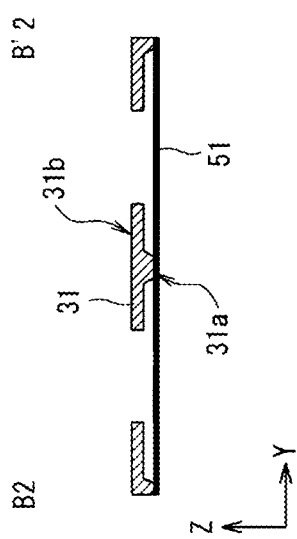

Firstly, as illustrated in FIGS. 5A and 5B, a pressure-sensitive adhesive sheet 51 having heat-resistance is prepared. Then, the top surface 31a of the lead frame 31 is attached to the adhesive layer of the pressure-sensitive adhesive sheet 51. It is to be noted that a resin tape having adherence and heat-resistance is used as the pressure-sensitive adhesive sheet 51. As to the adherence, the adhesive of the adhesive layer is preferably thin. Furthermore, the heat resistance is demanded to be tolerant to approximately 150° C. to 200° C. As such a pressure-sensitive adhesive sheet 51, polyimide tapes can be used, for example. The polyimide tapes are heat resistant to be tolerant to approximately 280° C. The highly heat-resistant polyimide tape is also tolerant to a high temperature heat generated in subsequent transfer molding and wire bonding.

Furthermore, as the pressure-sensitive adhesive sheet 51, the following tapes can be used instead of the polyimide tapes.

Polyester tapes: heatproof temperature approximately 130° C. (However, the heat proof temperature may reach up to approximately 200° C. depending on the use condition.)

Teflon (registered trade mark) tape: heat resistance temperature approximately 180° C.

Polyphenylene sulfide (PPS): heat proof temperature approximately 160° C.

Glass cloth: heat proof temperature approximately 200° C.

Nomex paper: heat proof temperature approximately 150 to 200° C.

In addition, aramid or crepe paper can be utilized as the pressure-sensitive adhesive sheet 51.

Figure 6B:
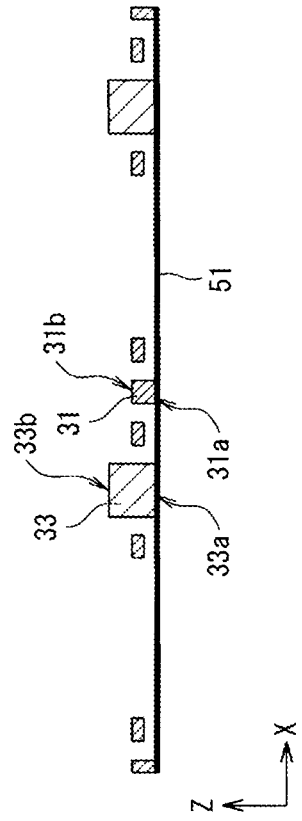
FIGS. 6A and 6B are views illustrative of the manufacturing method of the infrared-sensor filter member 10.
Figure 6A:
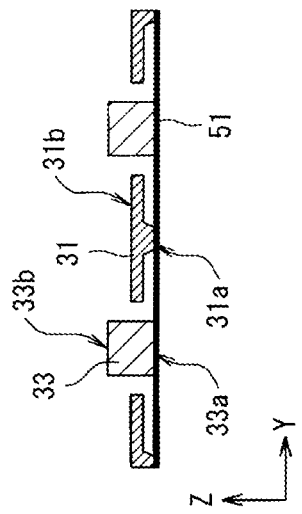

Next, as illustrated in FIGS. 6A and 6B, the optical filter 33 is disposed in the penetrating opening portion h1 of the lead frame 31, and the top surface (that is the light-incident surface) 33a thereof, for example, is attached to the adhesive layer of the pressure-sensitive adhesive sheet 51. It is to be noted that protective films (not illustrated) may be attached to the top surface 33a and the back surface (that is, the light-exit surface) 33b of the optical filter 33 beforehand.

Figure 8B:
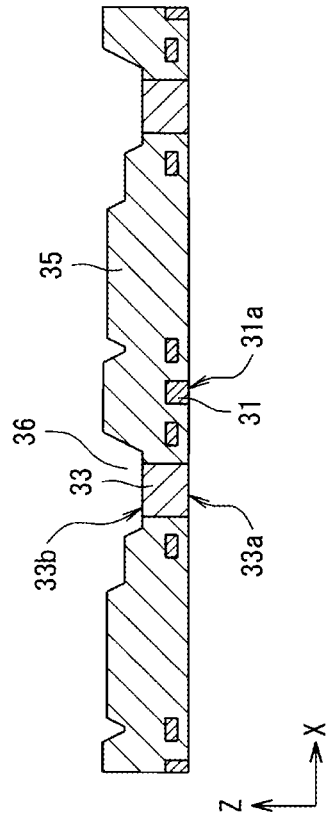
FIGS. 8A and 8B are views illustrative of the manufacturing method of the infrared-sensor filter member 10.
Figure 8A:
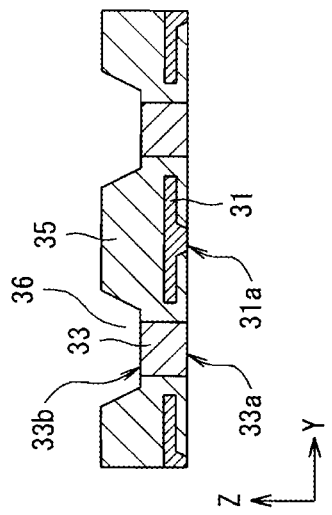

Next, as illustrated in FIGS. 7A and 7B, a lower mold 57 is disposed on the top surface 31a side of the lead frame 31 and an upper mold 55 is disposed on the back surface 31b side of the lead frame 31. Then, the optical filter 33 is sandwiched by the upper mold 55 and the lower mold 57, and the melted first member is injected and filled into a space (that is, a cavity) sandwiched by the upper mold 55 and the lower mold 57 from the side thereof. An epoxy resin, for example, is used as the first member. In this way, the first member 35 is formed (shaped). As illustrated in FIGS. 7A and 7B, a surface on the lower side (that is, the cavity side) of the upper mold 55 has an uneven shape in a cross-sectional view. A protrusion portion 55a faces the optical filter 33. As illustrated in FIGS. 8A and 8B, the recess portion 36 is formed by the protrusion portion 55a.

Furthermore, in the forming step of the first member 35, the epoxy resin or the like is injected and filled in a state in which the protrusion portion 55a of the upper mold 55 comes into contact with the optical filter 33 without a gap via a fluororesin sheet 58 and the non-etched region on the top surface 31a side of the lead frame 31 comes into contact with the lower mold 57 without a gap via the pressure-sensitive adhesive sheet 51. In this way, after the first member 35 is formed, the non-etched region of the top surface 31a of the lead frame 31, and the top surface 33a and the back surface 33b of the optical filter 33 are exposed from the molded member 35. The back surface 31b of the lead frame 31, the half-etched region of the top surface 31a, and the side surfaces of the optical filter 33 are covered with the first member 35.

Next, by moving the upper mold 55 and the lower mold 57 upward and downward, respectively, the lead frame 31 on which the first member 35 is formed is extracted from between the both molds, as illustrated in FIGS. 8A and 8B. Then, the pressure-sensitive adhesive sheet 51 is removed from the top surface 31a side of the lead frame 31. After the pressure-sensitive adhesive sheet 51 is removed, post curing for further curing the first member 35 is performed, and when wet blasting is necessary for completely removing thin burrs by the first member 35, wet blasting is performed. Furthermore, when the protective films (not illustrated) are formed on the top surface 33a and the back surface 33b of the optical filter 33, the protective films are removed.

Next, as illustrated in FIGS. 9A and 9B, a dicing tape 59 is attached to a back surface side (that is, a side having the recess portion 36) of the first member 35 and die singulation is performed by a dicing machine. Thus, the lead frames 31 and the first members 35 are cut out with a kerf width illustrated in FIGS. 2A and 2B. In this way, as illustrated in FIGS. 10A and 10B, the lead frames 31 and the first members 35 are separated into individual products and packaged, and the infrared-sensor filter member 10 illustrated in FIGS. 1A to 1D is completed.

(Manufacturing Method of Infrared Sensor Member)

FIGS. 11A to 11F are cross-sectional views illustrative of the manufacturing method of the infrared sensor member 50 in order of process sequence. Herein, each step will be described by using a cross-sectional surface of the lead frame (the third member) 41 or the like taken along the A3-A'3 line illustrated in FIG. 3A.

Firstly, as illustrated in FIG. 11A, a pressure-sensitive adhesive sheet 61 having heat-resistance is prepared. Next, the back surface 41b of the copper lead frame 41 externally plated with Ni/Pd/Au as described above is attached to an adhesive layer of the pressure-sensitive adhesive sheet 61. It is to be noted that the same tape as the pressure-sensitive adhesive sheet 51 can be used as the pressure-sensitive adhesive sheet 61.

Next, as illustrated in FIG. 11B, the IR sensor element 43 is disposed in the penetrating opening portion h2 of the lead frame 41, and the back surface (that is the light receiving surface) 43a the IR sensor element 43 is attached to the adhesive layer of the pressure-sensitive adhesive sheet 61. Furthermore, the signal processing IC (not illustrated) is attached on the die pad of the lead frame 41 by using silver (Ag) paste, for example.

Next, as illustrated in FIG. 11C, the signal processing IC and the lead frame 41 are electrically connected by the wires 45, and the IR sensor element 43 and the signal processing IC are electrically connected by the wires 45. The wire 45 illustrated in the drawing is a wire electrically connecting the signal processing IC (not illustrated) disposed at the back of the IR sensor element 43 and the lead frame 41. It is to be noted that the connection between the signal processing IC and the lead frame 41 is preferably achieved by extending the wire 45 from a terminal portion of the lead frame 41 toward pad electrodes of the signal processing IC (that is, reverse bonding when seen from the signal processing IC). Since the terminal portion of the lead frame 41 is located lower than the pad electrodes of the signal processing IC, it is possible to lower the height of the bonded wire 45.

Next, as illustrated in FIG. 11D, an upper mold 65 is disposed on the top surface 41a side of the lead frame 41 and a lower mold 67 is disposed on the back surface 41b side of the lead frame 41. Then, the lead frame 41 is sandwiched by the upper mold 65 and the lower mold 67, and a melted epoxy resin or the like is injected and filled into a space sandwiched by the upper mold 65 and the lower mold 67 from the side thereof. In this way, the molded member 46 is formed (shaped). It is to be noted that the same material as that of the first member 35 can be used as the material of the molded member 46.

Next, by moving the upper mold 65 and the lower mold 67 upward and downward, respectively, the lead frame 41 on which the molded member 46 is formed is extracted from between the both molds as illustrated in FIG. 11E. Then, the pressure-sensitive adhesive sheet 61 is removed from the back surface 41b side of the lead frame 41. After the pressure-sensitive adhesive sheet 61 is removed, post curing for further curing the molded member 46 is performed, and when wet blasting is necessary for completely removing thin burrs by the first member 35, wet blasting is performed.

Next, a dicing tape (not illustrated) is attached to the molded member 46 and the lead frame 41 and die singulation is performed by the dicing machine. Thus, the lead frames 41 and the molded members 46 are cut out with a kerf width illustrated in FIGS. 3A and 3B. In this way, as illustrated in FIG. 11F, the molded members 46 and the lead frames 41 are separated into individual products and packaged, and the infrared sensor member 50 illustrated in FIGS. 1A to 1D is completed.

(Connecting Method of Both Members)

Figure 12A:
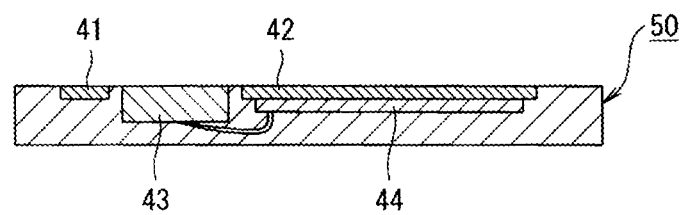
FIGS. 12A to 12C are views illustrative of a connecting method of the infrared-sensor filter member 10 and the infrared sensor member 50.
Figure 12B:
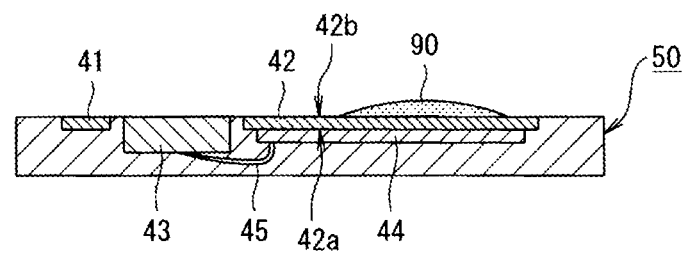
Figure 12C:
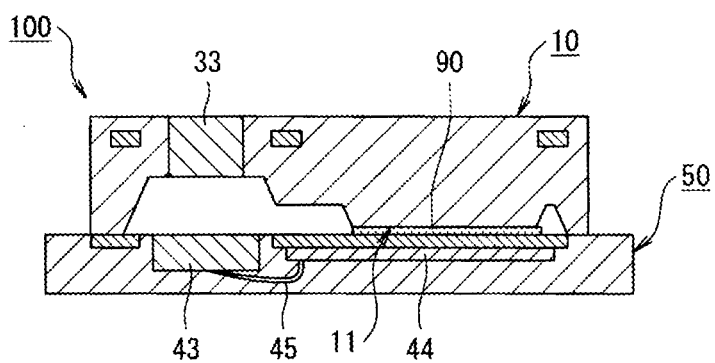

FIGS. 12A to 12C are views illustrative of the connecting method of the infrared-sensor filter member 10 and the infrared sensor member 50. Firstly, the infrared sensor member 50 is prepared as illustrated in FIG. 12A. Next, as illustrated in FIG. 12B, insulating paste 90 as a connecting member is applied to the back surface side of the infrared sensor member 50. The region to which the insulating paste 90 is applied may be a region other than the optical filter 33. For example, the insulating paste 90 is applied to a back surface 42b side of the die pad 42 of the lead frame 41 (that is, the opposite side of a surface 42a to which the signal processing IC is attached). As described above, the insulating paste 90 is a thermosetting epoxy resin, for example, and is applied by using a dispenser or a stamp. Then, as illustrated in FIG. 12C, the back surface side of the infrared-sensor filter member 10 comes into contact with the back surface of the infrared sensor member 50 to which the insulating paste 90 is applied, and the insulating paste 90 is cured by carrying out, for example, a thermal treatment. The infrared-sensor filter member 10 is attached to the infrared sensor member 50 in this way, the infrared sensor 100 illustrated in FIGS. 1A to 1D is completed.

(Modification)

In FIGS. 12A to 12C, a case in which one infrared sensor member 50 is attached to one infrared-sensor filter member 10 has been described. However, a member in which plural infrared sensor members 50 are connected illustrated in FIG. 11E may be connected to a member in which plural infrared-sensor filter members 10 are connected, and these members may be separated into individual products as illustrated in FIG. 11F to complete the infrared sensors 100.

Effects of First Embodiment

The first embodiment of the present disclosure exhibits the following effects.

(1) The light-exit surface 33b of the optical filter 33 facing the light receiving surface 43b of the IR sensor element 43 is positioned on the bottom surface of the recess portion 36 of the infrared-sensor filter member 10. Therefore, when the infrared-sensor filter member 10 is attached to the infrared sensor member 50 by the insulating paste 90, an adhered region 11 of the infrared-sensor filter member 10 (that is, a region coming into contact with the insulating paste 90) and the light-exit surface 33b are not on the same plane in a cross-sectional view, and the light-exit surface 33b is located at a position recessed relative to the adhered region 11. Thus, it is possible to prevent the light-exit surface 33b of the optical filter 33 from being contaminated by the adhesive.

(2) Furthermore, the inner side surfaces 36a of the recess portion 36 are inclined relative to the bottom surface such that the diameter of the recess portion 36 gradually increases from the bottom surface of the recess portion 36 (that is the back surface 33b side of the optical filter 33) toward the opening surface. That is, the inner side surfaces 36a of the recess portion 36 are inclined relative to the bottom surface such that the area of the opening surface of the recess portion 36 is larger than the area of the bottom surface of the recess portion 36. Therefore, it is possible to prevent the infrared ray from the light-exit surface 33b of the optical filter 33 from being reflected to enter the light receiving surface 43b of the IR sensor element, in comparison with a case the inner side surface of the recess portion is perpendicular to the bottom surface.

(3) Furthermore, the light receiving portion 144 includes the four light receiving regions 144a to 144d divided into upper, lower, right, and left regions in a plan view. The view angles of these light receiving regions 144a to 144d are restricted by inner side surfaces of the recess portion 36 and the side surfaces of the optical filter 33. Therefore, it is possible to prevent the view angles of the light receiving regions 144a to 144d from partially overlapping with one another.

For example, an upper view angle of the light receiving region 144a positioned on the upper side in a plan view is restricted by the inner side surfaces 36a of the recess portion 36. Therefore, even the light receiving region 144a can receive an IR incident from diagonally above when viewed from the light receiving region 144a, the range of the angle receivable the IR is restricted more than that of an IR incident from diagonally below when viewed from the light receiving region 144a. Similarly, a left view angle of a light receiving region 144b positioned on the left side in a plan view is restricted by the inner side surfaces 36a of the recess portion 36. Therefore, even the light receiving region 144b can receive an IR incident from diagonally left when viewed from the light receiving region 144b, the receivable angle range of the angle of the IR is restricted more than that of an IR incident from diagonally right when viewed from the light receiving region 144b. The same applies to the light receiving regions 144c and 144d.

(4) Furthermore, the infrared-sensor filter member 10 is fixed on the back surface 42b side of the die pad 42 by the insulating paste 90. This makes it easy to secure a large contact area of the infrared-sensor filter member 10 and the infrared sensor member 50.

(5) Furthermore, the adhered region 11 of the infrared-sensor filter member 10 is positioned in a recess portion. That is, in a cross-sectional view, the adhered region 11 of the infrared-sensor filter member 10 is slightly recessed from the other surface of the infrared-sensor filter member 10 coming into contact with the infrared sensor member 50. The depth of the recess portion in the adhered region 11 is set by considering the thickness of the insulating paste 90 applied (for example, the same thickness as, or a slightly smaller thickness than that of the insulating paste 90 applied). Therefore, it is possible to retain the insulating paste 90 in the recess portion in the adhered region 11 during the attachment of the infrared-sensor filter member 10 to the infrared sensor member 50, which prevents the insulating paste 90 from protruding outside from the adhered region 11. Thus, it is possible to further prevent the optical filter 33 from being contaminated by the insulating paste 90.

(6) Furthermore, the opening portion h1 in which the optical filter 33 is disposed is formed in the lead frame 31, and the opening portion h2 in which the IR sensor element 43 is disposed is formed in lead frame 41. Therefore, it is not necessary to form a deep opening portion in one lead frame in which both of the optical filter and the IR sensor element can be disposed. It is possible to make each of the depths of the opening portions h1 and h2 small, and this makes it possible to make each of the opening widths small accordingly. Thus, it is possible to downsize the infrared sensor. Furthermore, the use of lead frames made of metal, as an infrared sensor member and as an infrared-sensor filter member, enhances the strength thereof.

(7) Furthermore, the first member 35 is formed by using the upper mold 55 and the lower mold 57 (that is, by using the transfer molding technology). The transfer molding technology makes it possible to precisely form the first member 35 in a preset shape and a preset size. Furthermore, using the pressure-sensitive adhesive sheet 51 and the fluororesin sheet 58 makes it possible to prevent an epoxy resin or the like from adhering to the light-incident surface 33a and the light-exit surface 33b of the optical filter 33.

(Modification)

(1) In the first embodiment, a case in which the insulating paste 90 is used as the connecting member to attach the infrared-sensor filter member 10 to the infrared sensor member 50 has been described. However, the adhesive may not be the insulating paste 90 but a conductive paste, such as silver (Ag) paste. Even in such a case, the back surfaces of the infrared-sensor filter member 10 and the infrared sensor member 50 can be adhered together.

(2) Furthermore, an opening portion or a groove penetrating from the inside to the outside of the infrared sensor 100 may be formed.

Figure 13A:
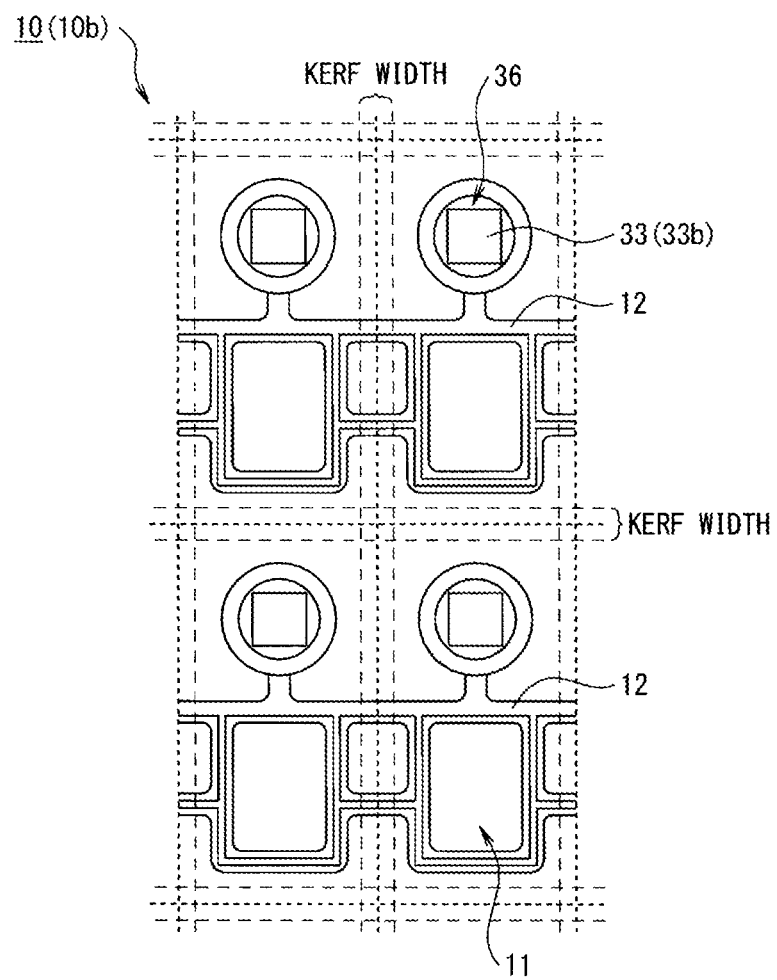
FIGS. 13A and 13B are views illustrative of a modification of the infrared-sensor filter member 10.
Figure 13B:
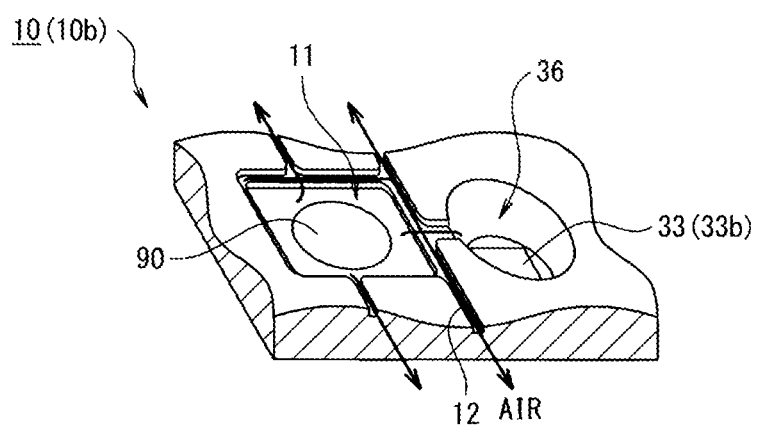

FIGS. 13A and 13B are a plan view and a perspective view illustrative of a modification of the infrared-sensor filter member 10. As illustrated in FIGS. 13A and 13B, for example, a groove 12 may be formed on the back surface 10b side of the infrared-sensor filter member 10. The groove 12 reaches the outside of the infrared-sensor filter member 10 (a kerf before die singulation) from the adhered region 11 and the recess portion 36. Such a configuration allows at least a part of residual air to escape from the adhered region 11 and the recess portion 36 to the outside via the groove 12. Therefore, it is possible to reduce a force generated by thermal expansion of the residual air, such as a force separating the infrared-sensor filter member 10 from the infrared sensor member 50 when the residual air is thermally expanded.

It is to be noted that the groove 12 can be formed, for example, by providing a protrusion portion corresponding to the shape of the size of the groove 12 on the upper mold 55 illustrated in FIGS. 7A and 7B. Since it is possible to form the first member 35 and the groove 12 at the same time by using the transfer molding technology, a dedicated step for forming the groove 12 is eliminated. In addition, the recess portion may have a conical shape or a pyramid shape.

Second Embodiment

In the first embodiment, a case in which the infrared-sensor filter member 10 covers the back surface 42b side of the die pad 42 of the lead frame 41 included in the infrared sensor member 50 has been described. In the second embodiment of the present disclosure, a part of or all of the back surface 42b side of the die pad 42 may be exposed from the infrared-sensor filter member 10.

That is, at least a part of the third member 41 is exposed from the outer surface of the infrared sensor member 50 in a region outside the infrared-sensor filter member 210 in a plan view. Furthermore, in the second embodiment of the present disclosure, at least a part of a second member 231 is exposed from the outer surface of the infrared-sensor filter member 210 so as to surround the light-incident surface 33a of the optical filter 33 in a plan view. Furthermore, in the second embodiment of the present disclosure, at least a part of the second member 231 is exposed from outer side surfaces of the infrared-sensor filter member 210. Such an embodiment will be described as the second embodiment.

(Configuration)

Figure 14A:
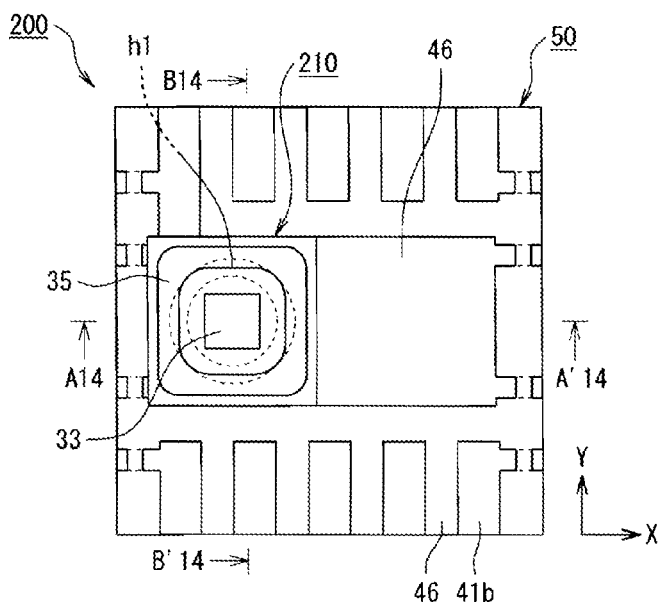
FIGS. 14A to 14D are views illustrative of a configuration example of an infrared sensor 200 according to the second embodiment.
Figure 14D:
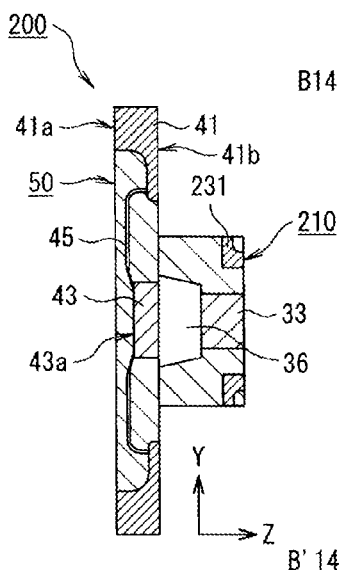
Figure 14B:
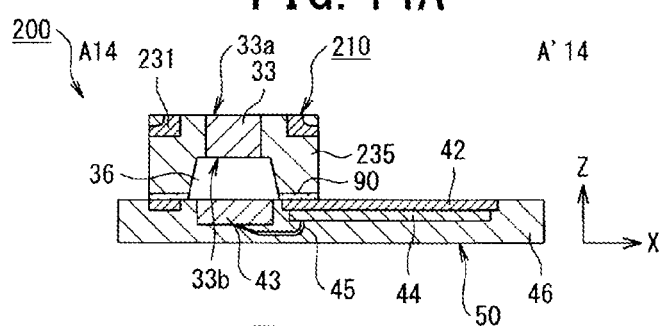
Figure 14C:
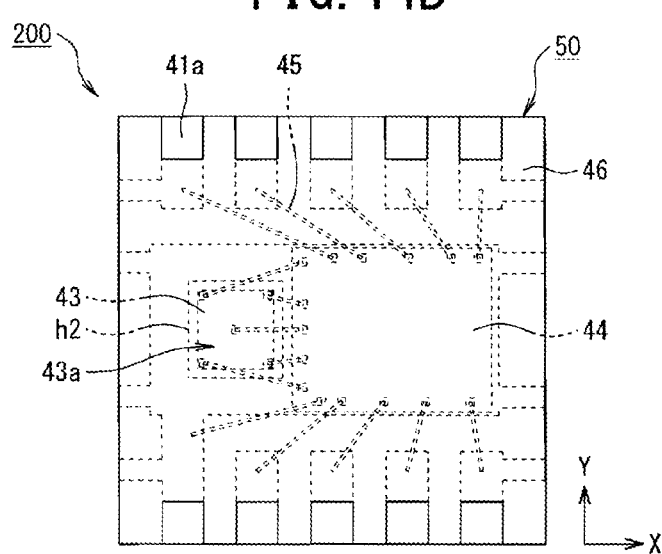

FIGS. 14A to 14D are illustrative views of a configuration example of an infrared sensor 200 according to the second embodiment of the present disclosure. Specifically, FIG. 14A is a plan view, FIG. 14B is a cross-sectional view taken along an A14-A'14 line (that is, a cross-sectional view parallel to the X-Z plane), FIG. 14C is a rear view, and FIG. 14D is a cross-sectional view taken along a B14-B'14 line (that is, a cross-sectional view parallel to the Y-Z plane).

As illustrated in FIGS. 14A to 14D, the infrared sensor 200 includes the infrared-sensor filter member 210 and the infrared sensor member 50. The back surfaces of the infrared-sensor filter member 210 and the infrared sensor member 50 are adhered together, for example via the insulating paste 90.

As illustrated in FIGS. 14A to 14D, the infrared-sensor filter member 210 includes the second member 231 on which a penetrating opening portion h1 is formed, the optical filter 33 disposed in the opening portion h1 of the second member 231, and a first member 235 configured to seal by covering the second member 231 and the side surfaces of the optical filter 33. In this example, the light-incident surface 33a and the light-exit surface 33b of the optical filter 33 and apart of the second member 231 is exposed from the first member 235.

Specifically, at least a part of the second member 231 is exposed from the outer surface of the infrared-sensor filter member 210 so as to surround the light-incident surface 33a of the optical filter 33 in a plan view. Furthermore, at least the part of the second member 231 is exposed from the outer side surface of the infrared-sensor filter member 210. Furthermore, the infrared-sensor filter member 210 is provided with the recess portion 36 formed from the light-exit surface 33b of the optical filter 33 and the first member 235. At least a part of a bottom surface of the recess portion 36 is formed by the light-exit surface 33b of the optical filter 33, and side walls of the recess portion 36 are formed of the first member 235. Furthermore, a recess portion (not illustrated) is also provided in an adhered region of the infrared-sensor filter member 210, similarly to the infrared-sensor filter member 10, and it is possible to retain the insulating paste 90 in the recess portion. It is to be noted that it is not necessary to provide the recess portion in the adhered region when using an applying method such as a stamp method capable of control of the amount of the insulating paste.

From the viewpoint of accurately determining the dose of the infrared ray within the view angle, in one embodiment, the second member 231 is a member with a small emissivity, for example, equal to or smaller than 0.3. An example of a member with a small emissivity is metal. Specifically, examples include copper, silver, gold, platinum, nickel, palladium, and the like. Hereinafter, an example in which a copper lead frame is used as the second member 231 will be described. It is to be noted that the reason why it is possible to accurately determine the dose of the infrared ray when the second member 231 is a member with a small emissivity will be described later.

Figure 15A:
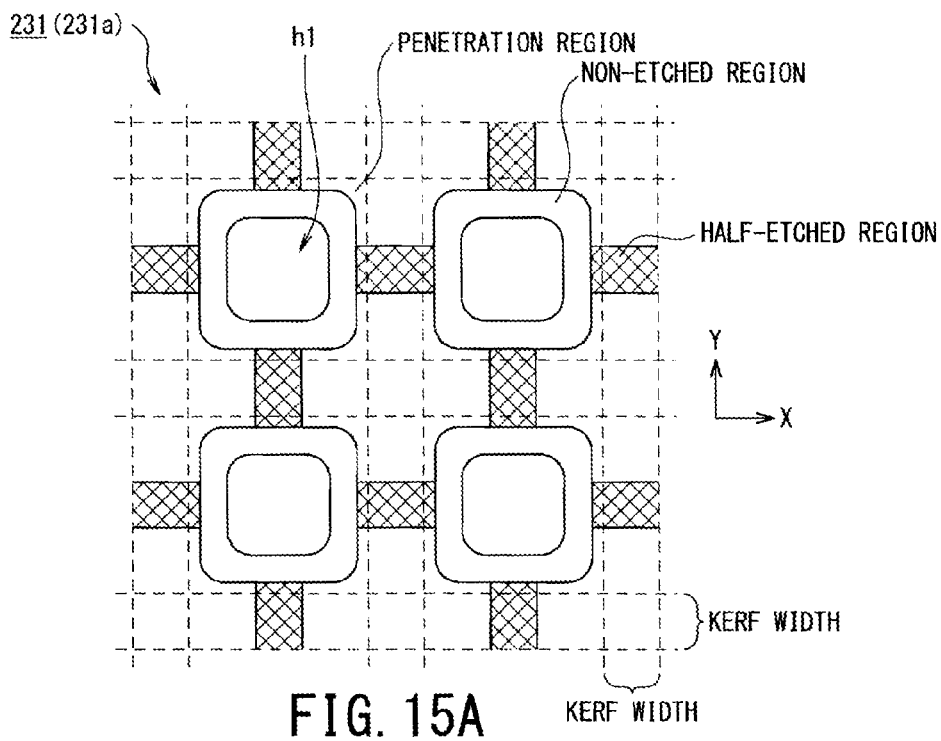
FIGS. 15A and 15B are views illustrative of a configuration example of a lead frame (the second member) 231.
Figure 15B:
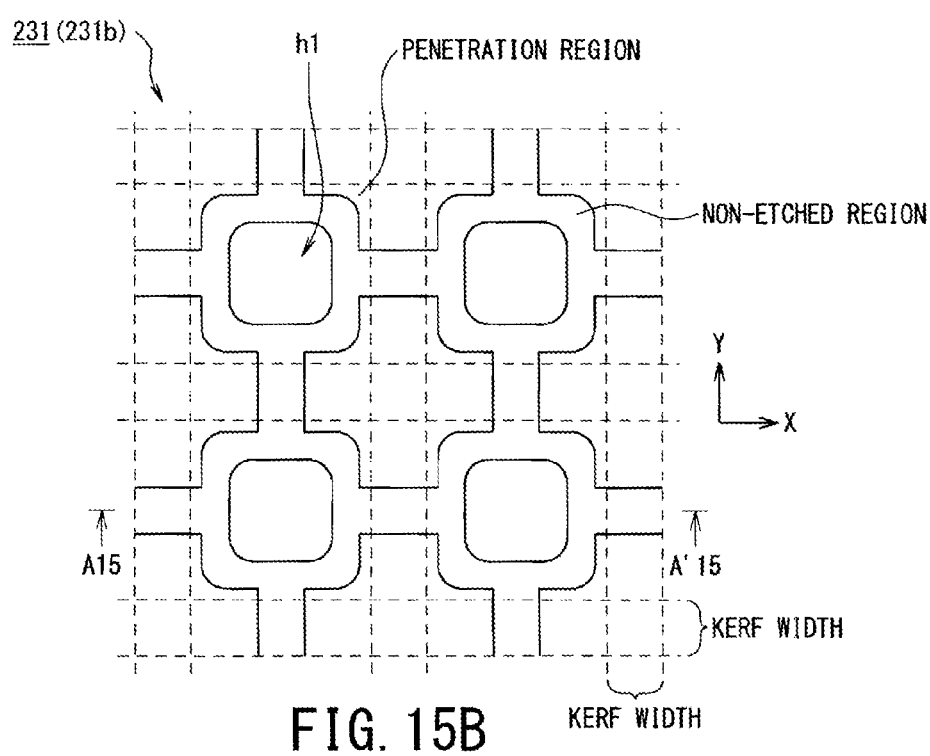

FIGS. 15A and 15B are views illustrative of a configuration example of the lead frame (the second member) 231. Specifically, FIG. 15A is a plan view illustrative of the top surface 231a side of the lead frame 231, and FIG. 15B is a bottom view of a back surface 231b side of the lead frame 231. The lead frame 231 is formed by selectively etching from each of the top surface 231a side and the back surface 231b side by using the photolithography technique.

As illustrated in FIGS. 15A and 15B, the lead frame 231 has a penetration region including the opening portion h1 formed by etching from each of the top surface 231a side and the back surface 231b side. Furthermore, the lead frame 231 has a half-etched region and a non-etched region on the top surface 231a, and has a non-etched region on the back surface 231b. There is not a half-etched region on the back surface 231b. The thickness of a portion of the lead frame 231 in which neither side is etched is, for example, 0.2 mm.

Returning to FIGS. 14A to 14D, in one embodiment, the first member 235 is a member tolerant to the high temperature in reflowing. Furthermore, from the viewpoint of accurately determining the dose of the infrared ray, in one embodiment, the first member 235 is a member with a large emissivity, for example, equal to or larger than 0.7. Examples of a member with a large emissivity and tolerant to the high temperature in reflowing includes an epoxy-based thermosetting resin, a polyphthalamide resin, a polyphenylene sulfide resin, a liquid crystal polymer. The package shape and the size of the infrared-sensor filter member 210 may be, for example, a rectangular parallelepiped shape 1.6 mm long, 1.6 mm wide and 0.8 mm thick.

(Manufacturing Method)

A manufacturing step of the infrared sensor 200 includes a manufacturing step of the infrared-sensor filter member 210, the manufacturing step of the infrared sensor member 50, and a connecting step of the infrared-sensor filter member 210 and the infrared sensor member 50. The manufacturing step of the infrared-sensor filter member 210 is similar to the manufacturing step of the infrared-sensor filter member 10 described in the first embodiment. A detailed description is given below.

FIGS. 16A to 16F are cross-sectional views illustrative of the manufacturing method of the infrared-sensor filter member 210 in order of process sequence. Herein, each step will be described by using a cross-sectional surface of the lead frame (the second member) 231 or the like taken along the A15-A'15 line illustrated in FIG. 15B.

Figure 16A:
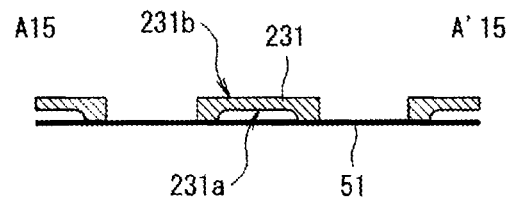
FIGS. 16A to 16F are views illustrative of a manufacturing method of an infrared-sensor filter member 210.
Figure 16B:
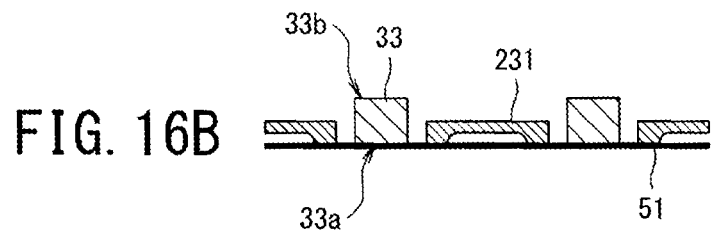

Firstly, as illustrated in FIG. 16A, the pressure-sensitive adhesive sheet 51 having heat-resistance is prepared. The top surface 231a of the lead frame 231 is attached to the adhesive layer of the pressure-sensitive adhesive sheet 51. Next, as illustrated in FIG. 16B, the optical filter 33 is disposed in the penetrating opening portion h1 of the lead frame 231, and the top surface (that is, the light-incident surface) 33a thereof, for example, is attached to the adhesive layer of the pressure-sensitive adhesive sheet 51. Similarly to the first embodiment, protective films (not illustrated) may be attached to the top surface (that is, the light-incident surface) 33a and the back surface (that is, the light-exit surface) 33b of the optical filter 33 beforehand.

Figure 16C:
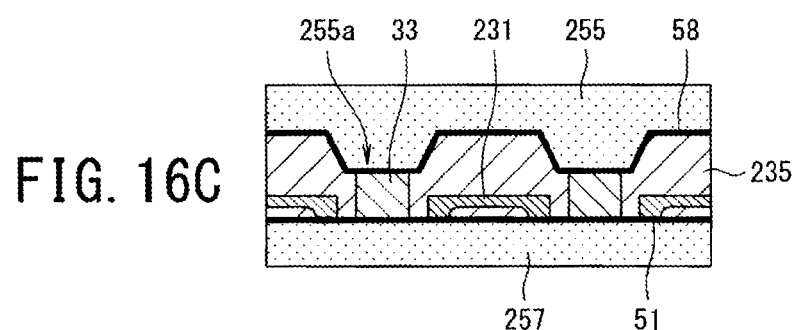
Figure 16D:
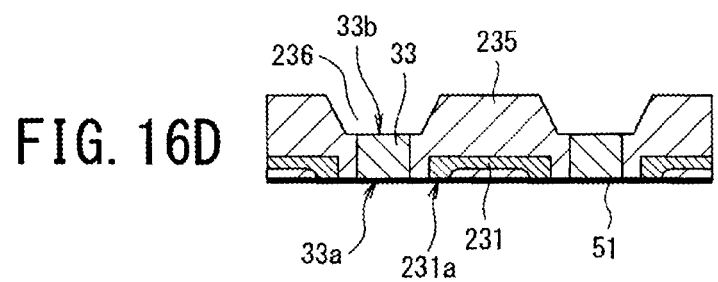

Next, as illustrated in FIG. 16C, an upper mold 255 is disposed on the top surface 231a side of the lead frame 231, and a lower mold 257 is disposed on the back surface 231b side of the lead frame 231. Then, the optical filter 33 is sandwiched by the upper mold 255 and the lower mold 257, and the melted first member is injected and filled into a space sandwiched by the upper mold 255 and the lower mold 257 from the side thereof. An epoxy resin, for example, is used as the first member. In this way, the first member 235 is formed (shaped). As illustrated in FIG. 16C, a surface on the lower side of the upper mold 255 has an uneven shape in a cross-sectional view. The protrusion portion 255a faces the optical filter 33. As illustrated in FIG. 16D, the recess portion 236 is formed on the first member 235 by the protrusion portion 255a.

In the forming step of the first member 235, the epoxy resin or the like is injected and filled in a state in which the protrusion portion 255a of the upper mold 255 comes into contact with the optical filter 33 without a gap via the fluororesin sheet 58 and the non-etched region on the top surface 231a side of the lead frame 231 comes into contact with the lower mold 257 without a gap via the pressure-sensitive adhesive sheet 51.

Next, the lead frame 231 on which the first member 235 is formed is extracted from between the upper mold 255 and the lower mold 257. Then, the pressure-sensitive adhesive sheet 51 is removed from the top surface 231a side of the lead frame 231. After the pressure-sensitive adhesive sheet 51 is removed, post curing and wet blasting are performed as needed. When the protective films (not illustrated) are formed on the top surface 33a and the back surface 33b of the optical filter 33, the protective films are removed.

Figure 16E:
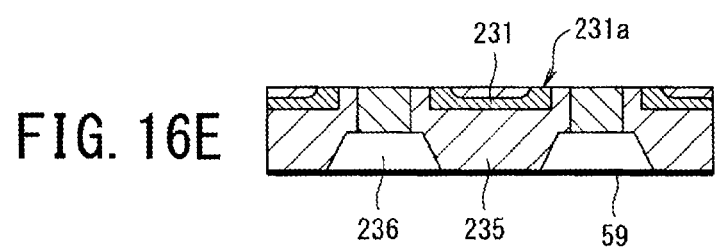
Figure 16F:
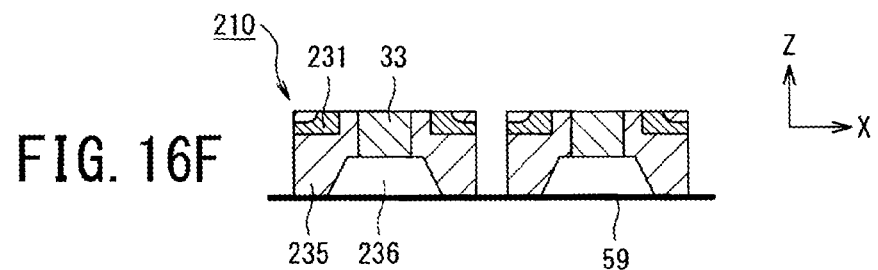

Next, as illustrated in FIG. 16E, the dicing tape 59 is attached to a back surface side of the first member 235 and die singulation is performed by the dicing machine. Thus, the lead frames 231 and the first members 235 are cut out with a kerf width illustrated in FIGS. 15A and 15B. In this way, as illustrated in FIG. 16F, the first members 235 and the lead frames 231 are separated into individual products and packaged, and the infrared-sensor filter member 210 illustrated in FIGS. 14A to 14D is completed. At least the part of the lead frame (the second member) 231 is exposed from the outer surface of the infrared-sensor filter member 210 so as to surround the light-incident surface 33a of the optical filter 33 in a plan view. Furthermore, at least the part of the lead frame (the second member) 231 is exposed from the outer side surface of the infrared-sensor filter member 210.

The connecting step of the infrared-sensor filter member 210 and the infrared sensor member 50 is also similar to the connecting step of the infrared-sensor filter member 10 and the infrared sensor member 50 described in the first embodiment. For example, the insulating paste 90 is applied to the back surface side of the infrared sensor member 50. The region to which the insulating paste 90 is applied may be a region other than the optical filter 33. Next, the back surface side of the infrared-sensor filter member 10 comes into contact with the back surface of the infrared sensor member 50 to which the insulating paste 90 is applied, and the insulating paste 90 is cured by carrying out, for example, the thermal treatment. The infrared-sensor filter member 210 is attached to the infrared sensor member 50 in this way, and the infrared sensor 200 illustrated in FIGS. 14A to 14D is completed.

Effects of Second Embodiment

According to the second embodiment of the present disclosure, the same effects as the effects (1) to (7) of the first embodiment are exhibited.

Furthermore, in the second embodiment, the second member 231 has a small emissivity and at least the part of the second member 231 is exposed from the outer surface of the infrared-sensor filter member 210, and thus it is possible to accurately determine the dose of the infrared ray. The reason will be described below.

The second member 231 with a small emissivity is exposed from the outer surface of the infrared-sensor filter member 210. Therefore, the infrared ray output from a target to be measured toward the outer surface of the infrared-sensor filter member 210 is reflected without being absorbed. This suppresses a change in the temperature of the infrared-sensor filter member 210. The quantum type infrared sensor element outputs a signal depending on a difference between infrared energy input from outside and infrared energy output from the quantum type infrared sensor element itself. The source of the infrared energy input from outside includes an outside viewed field that is the outer side of the optical filter and the inner wall (an inside viewed field) of the recess portion of the infrared-sensor filter member. As described above, since the change in the temperature of the infrared-sensor filter member is suppressed, a change in the dose of the infrared ray input from the inside viewed field is reduced.

For these reasons, when the second member 231 with a small emissivity is exposed from the outer surface of the infrared-sensor filter member 210, it is possible to accurately determine the dose of the infrared ray. Since infrared ray irradiation usually peaks in regions around the optical filter, it is preferred a second member 231 having a small emissivity exposed from the outer surface of the infrared-sensor filter member so as to surround the light-incident surface of the optical filter in a plan view. Furthermore, the second member with a small emissivity may be exposed from the outer side surface of the infrared-sensor filter member. In one embodiment, the second member 231 is a member with an emissivity equal to or smaller than 0.3. An example of a member with a small emissivity is metal. Specifically, examples include copper, silver, gold, platinum, nickel, palladium, and the like.

Furthermore, in the second embodiment, the third member 41 has a small emissivity and at least a part of the third member 41 is exposed from the outer surface of the infrared sensor member 50 in a region outside the infrared-sensor filter member 210 in a plan view. Thus, it is possible to accurately determine the dose of the infrared ray. The reason will be described below.

In the second embodiment, at least a part of the third member 41 is exposed from the outer surface of the infrared sensor member 50 in the region outside the infrared-sensor filter member 210 in a plan view. Therefore, the infrared ray output from the target to be measured toward the outer surface of the infrared sensor member 50 is reflected without being absorbed. This suppresses a change in the temperature of the infrared sensor member 50, and thus a change in the temperature of the quantum type infrared sensor element is suppressed. As described above, the quantum type infrared sensor element outputs a signal depending on the difference between the infrared energy input from outside and the infrared energy output from the quantum type infrared sensor element itself. Since the change in the temperature of the quantum type infrared sensor element is suppressed, the change in the infrared energy output from the infrared sensor element itself due to the temperature change is suppressed, and thus it is possible to accurately determine the dose of the infrared ray.

In one embodiment, the third member 41 is a member with an emissivity equal to or smaller than 0.3. An example of a member with a small emissivity is metal. Specifically, examples include copper, silver, gold, platinum, nickel, palladium, and the like.

Furthermore, in the second embodiment, the first member 235 forming the inner wall of the recess portion 36 has a large emissivity, infrared energy input from outside a predetermined view angle is absorbed at the inner wall of the recess portion 36. Therefore, it is possible to accurately determine the dose of the infrared ray in the view angle. In one embodiment, the first member 235 is a member with an emissivity equal to or larger than 0.7. Examples of a member with a large emissivity include an epoxy-based thermosetting resin, a polyphthalamide resin, a polyphenylene sulfide resin, a liquid crystal polymer.

In addition, when the infrared ray incident into the recess portion of the infrared-sensor filter member is diffusely reflected, the dose of the infrared ray input to the infrared sensor element and the detected dose thereof vary. In the second embodiment, the light receiving surface of the infrared sensor element is exposed from the infrared sensor member, and the light receiving surface of the infrared sensor element is surrounded by a member with an emissivity equal to or larger than 0.7 in a surface out of the outer surface of the infrared sensor element on which the light receiving surface of the infrared sensor element is exposed. In this way, it is possible to absorb the diffused reflection in the recess portion.

(Modification)

The modifications (1) and (2) described in the first embodiment may be applied to the second embodiment of the present disclosure.

An example in which a copper lead frame is used as the second member has been described. The second member may be a lead frame 241 externally plated with Ni/Pd/Au, similarly to the manufacturing method of the infrared sensor member. This exhibits an effect of preventing temporal changes in the lead frame such as oxidation.

Third Embodiment

In the first and second embodiments, examples in which the first member making up the side wall of the recess portion of the infrared-sensor filter member is made of epoxy-based thermosetting resin and has a high emissivity has been mainly described. In the third embodiment, an example in which the first member which composes the side wall of the recess portion is a metal member with an emissivity equal to or smaller than 0.3, will be mainly described.

(Configuration)

Figure 17A:
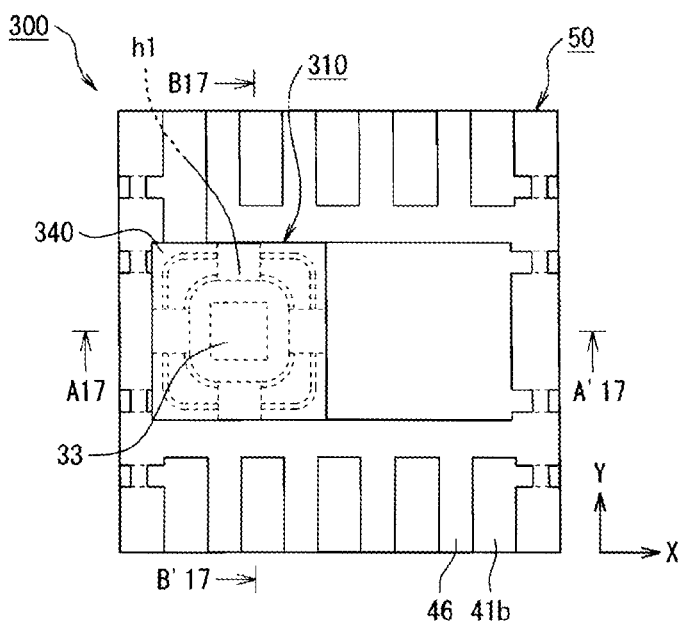
FIGS. 17A to 17D are views illustrative of a configuration example of an infrared sensor 300 according to the third embodiment.
Figure 17D:
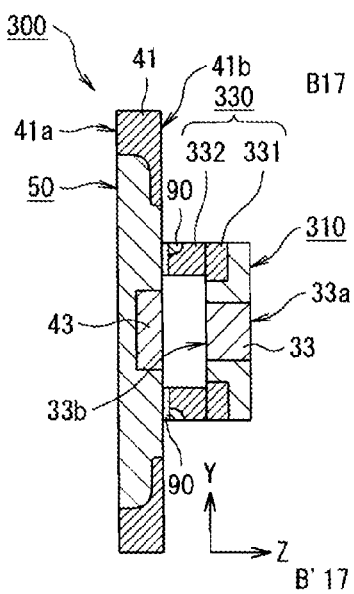
Figure 17B:
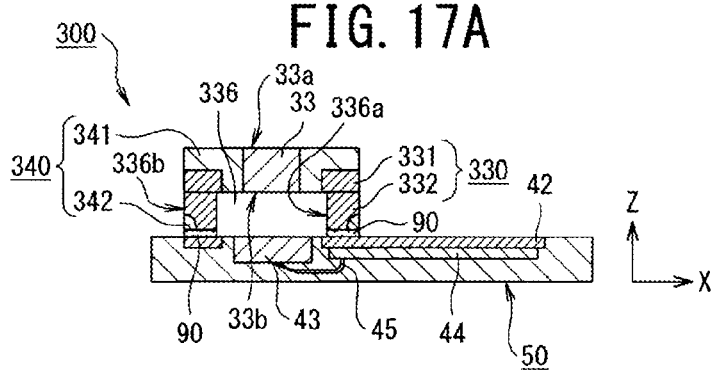
Figure 17C:
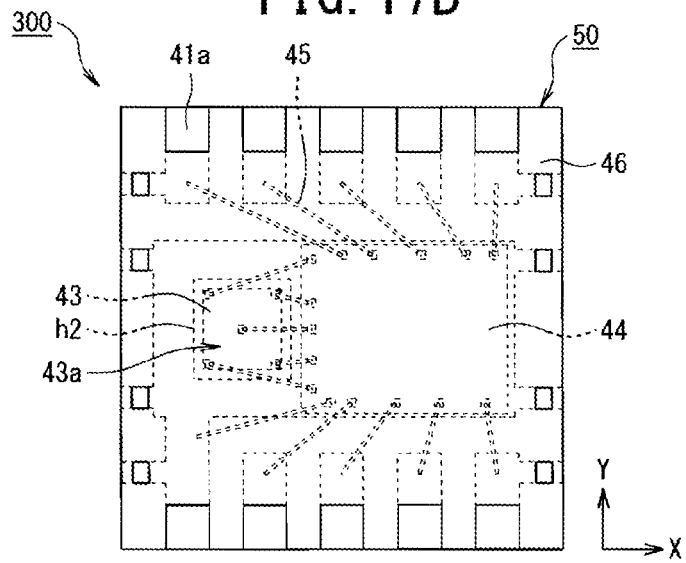

FIGS. 17A to 17D are illustrative views of a configuration example of an infrared sensor 300 according to the third embodiment of the present disclosure. Specifically, FIG. 17A is a plan view, FIG. 17B is a cross-sectional view taken along an A17-A'17 line (that is, a cross-sectional view parallel to the X-Z plane), FIG. 17C is a rear view, and FIG. 17D is a cross-sectional view taken along a B17-B'17 line (that is, a cross-sectional view parallel to the Y-Z plane).

As illustrated in FIGS. 17A to 17D, the infrared sensor 300 includes an infrared-sensor filter member 310 and the infrared sensor member 50. The back surfaces of the infrared-sensor filter member 310 and the infrared sensor member 50 are adhered together, for example via the insulating paste 90.

As illustrated in FIGS. 17A to 17D, the infrared-sensor filter member 310 includes a lead frame 330 on which a penetrating opening portion h1 is formed, an optical filter 33 disposed in the opening portion h1 of the lead frame 330, and a molded member 340 configured to cover to seal the lead frame 330 and the side surfaces of the optical filter 33. In this example, the light-incident surface 33a and the light-exit surface 33b of the optical filter 33 and a part of the lead frame 330 are exposed from the molded member 340.

The outer shape and the size of the molded member 340, that is, the package shape and the size of the infrared-sensor filter member 310 are, for example, a rectangular parallelepiped shape 1.6 mm long, 1.6 mm wide and 0.8 mm thick.

The lead frame 330 includes an upper layer lead frame 331 and a lower layer lead frame 332. As illustrated in FIGS. 17B and 17D, the upper layer lead frame 331 is laminated on the lower layer lead frame 332. This laminated state is fixed by, for example, the molded member 340. The infrared-sensor filter member 310 is provided with the recess portion 336 formed by the light-exit surface 33b of the optical filter 33 and the lower layer lead frame 332.

At least a part of a bottom surface of the recess portion 336 is formed of the light-exit surface 33b of the optical filter 33, and side walls of the recess portion 336 are formed of the lower layer lead frame 332. The lower layer lead frame 332 corresponds to the first member in the first and second embodiment of the present disclosure. Furthermore, the lower layer lead frame (the first member) 332 includes exposed portions on inner side surfaces 336a of the recess portion 336. The exposed portions are subjected to blackening treatment. Herein, the blackening treatment is a treatment for blackening or color-deepening. The reflection of the light at the exposed surfaces of the lower layer lead frame 332 can be prevented by the blackening treatment.

Figure 18A:
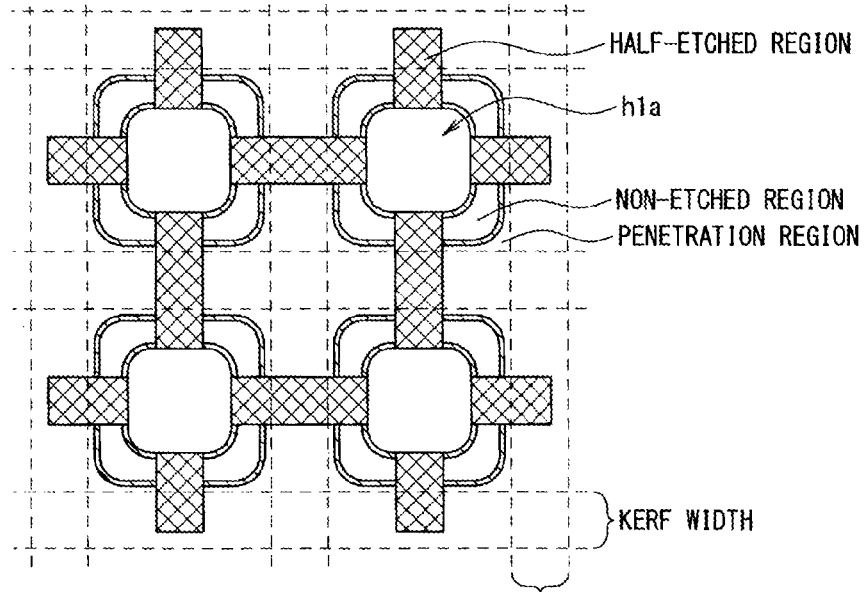
FIGS. 18A and 18B are views illustrative of a configuration example of a lead frame 330.
Figure 18B:
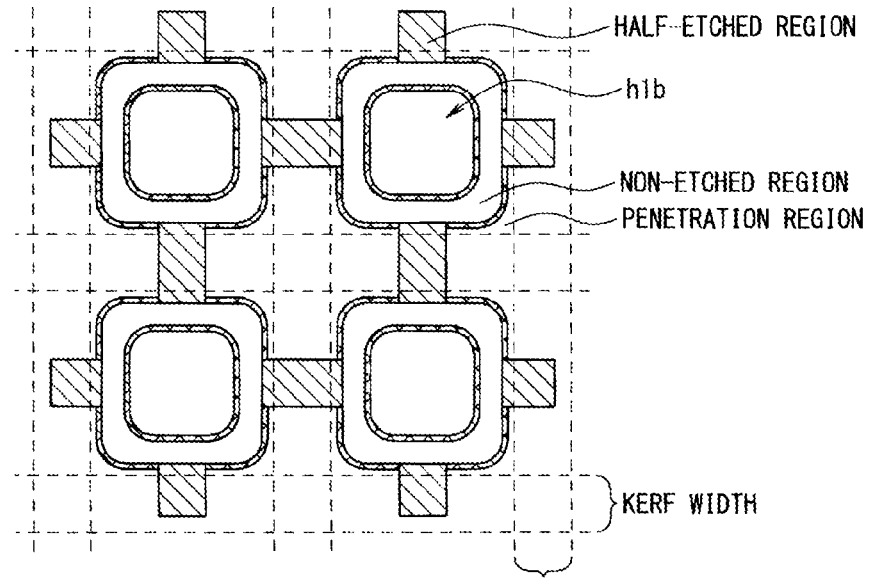

FIGS. 18A and 18B are views illustrative of a configuration example of the lead frame 330. Specifically, FIG. 18A is a plan view illustrative of the top surface 331a side of the upper layer lead frame 331, and FIG. 18B is a bottom view illustrative of a back surface 332b side of the lower layer lead frame 332. The upper layer lead frame 331 is formed by selectively etching, for example, a copperplate, from each of the top surface side and the back surface side by using the photolithography technique. The lower layer lead frame 332 is also formed by the similar way.

As illustrated in FIG. 18A, the upper layer lead frame 331 has a penetration region including the opening portion h1a formed by etching from each of the top surface 331a side and the back surface side. Furthermore, the upper layer lead frame 331 has a half-etched region and a non-etched region on the top surface 330a, and has a non-etched region on the back surface. There is no half-etched region on the back surface (not illustrated) of the upper layer lead frame 331.

Similarly, as illustrated in FIG. 18B, the lower layer lead frame 332 has a penetration region including the opening portion h1b formed to penetrate by etching from each of the top surface 332a side and the back surface side. Furthermore, the lower layer lead frame 332 has a half-etched region and a non-etched region on the top surface 332a, and has a non-etched region on the back surface. There is no half-etched region on the back surface (not illustrated) of the lower layer lead frame 332. The opening portion h1 is formed by overlapping the opening portions h1a and h1b. The thickness of a portion of each of the upper layer lead frame 331 and the lower layer lead frame 332 that is not etched is, for example, 0.4 mm.

(Manufacturing Method)

Figure 19A:
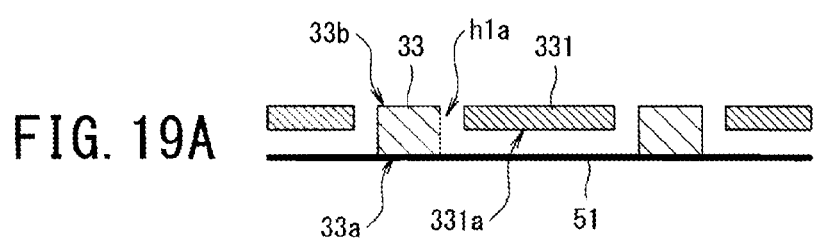
FIGS. 19A to 19F are views illustrative of a manufacturing method of an infrared-sensor filter member 310 according to the third embodiment.
Figure 19B:
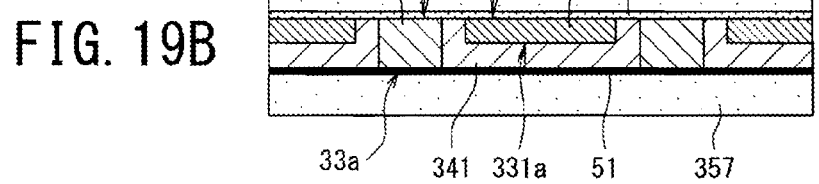

FIGS. 19A and 19B are illustrative cross-sectional views of a manufacturing method of the infrared-sensor filter member 310 according to the third embodiment of the present disclosure in order of process sequence. Herein, each step will be described by using a cross-sectional surface of the lead frame 330 or the like taken along the B17-B'17 line illustrated in FIG. 17A.

Firstly, as illustrated in FIG. 19A, the pressure-sensitive adhesive sheet 51 having heat-resistance is prepared. Next, the non-etched region (not illustrated) in the top surface 331a of the upper layer lead frame 331 is attached to the adhesive layer of the pressure-sensitive adhesive sheet 51. Next, the optical filter 33 is disposed in the penetrating opening portion h1a of the upper layer lead frame 331, and the top surface (that is, the light-incident surface) 33a thereof, for example, is attached to the adhesive layer of the pressure-sensitive adhesive sheet 51. It is to be noted that protective films (not illustrated) may be attached to the top surface (that is, the light-incident surface) 33a and the back surface (that is, the light-exit surface) 33b of the optical filter 33 beforehand.

Next, as illustrated in FIG. 19B, a lower mold 357 is disposed on the top surface 331a side of the upper layer lead frame 331, and an upper mold 355 is disposed on the back surface 331b side of the upper layer lead frame 331. Then, the optical filter 33 is sandwiched by the upper mold 355 and the lower mold 357, and a melted epoxy resin or the like is injected and filled into a space (that is, a cavity) sandwiched by the upper mold 355 and the lower mold 357 from the side thereof. In this way, a molded member 341 that seals the upper layer lead frame 331 and the side surfaces of the optical filter 33 is formed (shaped).

In the forming step of the molded member 341, the epoxy resin or the like is injected and filled in a state in which the upper mold 355 comes into contact with the optical filter 33 and the back surface side of the upper layer lead frame 331, without any gap, via the fluororesin sheet 58, and the non-etched region on the top surface 331a side of the upper layer lead frame 331 comes into contact with the lower mold 357, without any gap, via the pressure-sensitive adhesive sheet 51. In this way, the molded member 341 is formed.

After the molded member 341 is formed, the non-etched regions of the top surface 331a and the back surface 331b of the upper layer lead frame 331 and the top surface 33a and the back surface 33b of the optical filter 33 are exposed from the molded member 341. The half-etched regions of the top surface 331a and the back surface 331b of the upper layer lead frame 331, and the side surface of the optical filter 33 are covered and sealed by the molded member 341. It is to be noted that the molded member 341 is made of an epoxy-based thermosetting resin, for example, similarly to the first member 35 to be tolerant to the high temperature in reflowing.

Figure 19C:
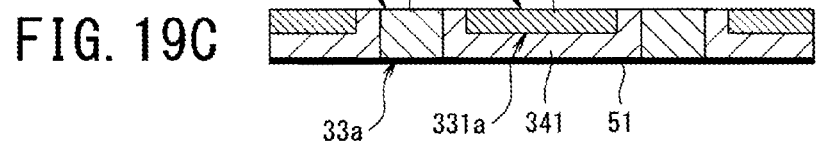

Then, by moving the upper mold 355 and the lower mold 357 upward and downward, respectively, the upper layer lead frame 331 on which the molded member 341 is formed is extracted from between the both molds, as illustrated in FIG. 19C.

Figure 19D:
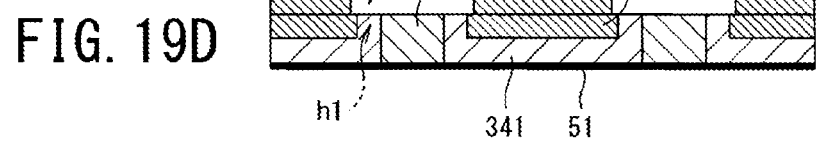

Next, as illustrated in FIG. 19D, the lower layer lead frame 332 is disposed on the back surface side of the upper layer lead frame 331. Herein, the back surface of the lower layer lead frame 332 faces the back surface of the upper layer lead frame 331, and the upper layer lead frame 331 and the lower layer lead frame 332 are positioned in this state such that the opening portion h2 vertically overlaps with the optical filter 33. Then, in a state in which these lead frames are positioned, the lower layer lead frame 332 is disposed on the back surface side of the upper layer lead frame 331 and is fixed. In this way, the lead frame 330 having a lamination structure is configured.

It is to be noted that the upper layer lead frame 331 and the lower layer lead frame 332 may be adhered to each other by an adhesive. Alternatively, the upper layer lead frame 331 and the lower layer lead frame 332 may be only temporarily fixed to each other to prevent a relative displacement. When these lead frames are temporarily fixed, the upper layer lead frame 331 and the lower layer lead frame 332 are fixed to each other by a molded member 342 in the forming step of the molded member 342 described later. The method of temporary fixing may use pins, for example.

That is, plural though holes (not illustrated) are provided on each of an outer periphery part of the upper layer lead frame 331 and an outer periphery part of the lower layer lead frame 332. The positions at which these though holes are formed are adjusted beforehand so as to vertically overlap when the upper layer lead frame 331 and the lower layer lead frame 332 are accurately positioned. By positioning the upper layer lead frame 331 and the lower layer lead frame 332 and fitting pins (not illustrated) with the plural though holes vertically overlapping, the upper layer lead frame 331 and the lower layer lead frame 332 are temporarily fixed to each other to prevent a displacement. Four corners may be arc welded or adhered by an adhesive after positioning.

Figure 19E:
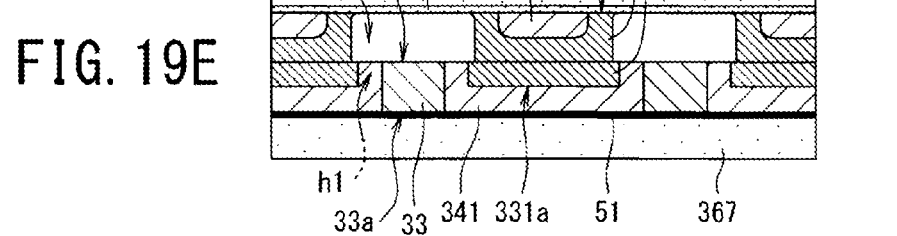

Next, as illustrated in FIG. 19E, an upper mold 365 is disposed on the top surface side 332a of the lower layer lead frame 332, and a lower mold 367 is disposed on the top surface 331a side of the upper layer lead frame 331. Then, in a state in which the upper mold 365 comes into contact with the top surface 332a side of the lower layer lead frame 332 without a gap via the fluororesin sheet 58, a melted epoxy resin or the like is injected and filled into the half-etched region on the top surface 331a side of the lower layer lead frame 332 from the side thereof. In this way, the molded member 342 is formed (shaped).

It is to be noted that the opening portion h2 is surrounded by the side surfaces of the lower layer lead frame 332 in the forming step of the molded member 342. Therefore, it is possible to prevent injection of the melted epoxy resin or the like into the opening portion h2. Furthermore, the molded member 342 is made of an epoxy-based thermosetting resin, for example, similarly to the molded member 341 to be tolerant to the high temperature in reflowing.

Figure 19F:
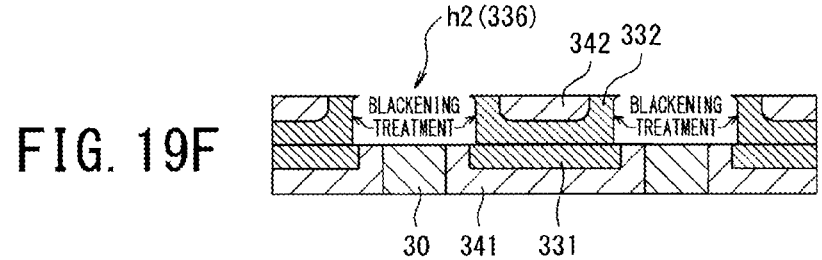

Next, the upper mold 365 and the lower mold 367 are removed, and then the pressure-sensitive adhesive sheet 51 is removed from the top surface 331a side of the upper layer lead frame 331. After the pressure-sensitive adhesive sheet 51 is removed, post curing is performed. Wet blasting is also performed as needed. Furthermore, when the protective films (not illustrated) are formed on the top surface 33a and the back surface 33b of the optical filter 33, the protective films are removed. Furthermore, before or after these process, the blackening treatment is applied to the inner side surfaces of the opening portion h2 (that is inner side surfaces 336a of the recess portion 336 illustrated in FIG. 17B) as illustrated in FIG. 19F. For example, the lead frame is made of copper, and the blackening treatment is performed by oxidizing a copper surface by using a chlorite in an alkaline solution to form an oxide film. The infrared-sensor filter member 310 illustrated in FIGS. 17A, 17B, and 17D is completed through the steps described above.

Effects of Third Embodiment

According to the third embodiment of the present disclosure, the same effects as the effects (1), (3), (4), (6), and (7) of the first embodiment are exhibited.

Furthermore, in the third embodiment of the present disclosure, the member making up the outer side surfaces 336b of the side wall of the recess portion 336 is made of metal, and the infrared ray output from the target to be measured toward the outer surface of the infrared-sensor filter member 340 is reflected without being absorbed. Therefore, the change in the temperature of the infrared-sensor filter member 340 is suppressed, and thus it is possible to accurately determine the dose of the infrared ray similarly to the second embodiment.

Furthermore, in the third embodiment of the present disclosure, since the inner side surfaces 336a of the side wall of the recess portion 336 has been subjected to the blackening treatment, the inner side surfaces 336a of the side wall of the recess portion 336 has a large emissivity. Therefore, it is possible to absorb an infrared energy input from outside the predetermined view angle at the inner side surfaces 336a of the recess portion 36, and thus it is possible to accurately determine the dose of the infrared ray within the predetermined view angle similarly to the second embodiment.

(Modification)

The modifications (1) and (2) described in the first embodiment may be applied to the third embodiment of the present disclosure.

Furthermore, in the third embodiment, the molded member 342, which is formed after the upper layer lead frame 331 and the lower layer lead frame 332, are laminated. However, the forming method of the infrared-sensor filter member 310 is not limited thereto. For example, the molded member 342 may be formed before the lamination of the upper layer lead frame 331 and the lower layer lead frame 332.

FIGS. 20A to 20D are illustrative cross-sectional views of a manufacturing method (modification) of the infrared-sensor filter member 310 in order of process sequence.

Figure 20A:
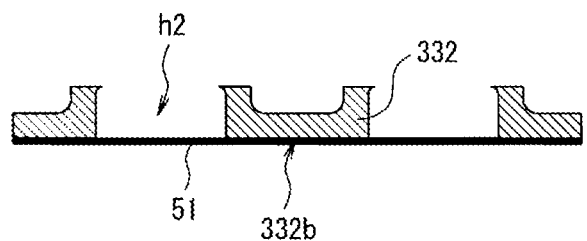
FIGS. 20A to 20D are views illustrative of a manufacturing method (modification) of the infrared-sensor filter member 310.
Figure 20B:
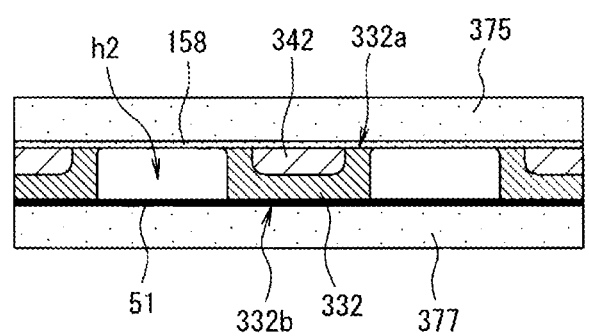

Firstly, as illustrated in FIG. 20A, the pressure-sensitive adhesive sheet 51 is prepared. The back surface 332b of the lower layer lead frame 332 is attached to the adhesive layer of the pressure-sensitive adhesive sheet 51. Next, as illustrated in FIG. 20B, an upper mold 375 is disposed on the top surface 332a side of the lower layer lead frame 332, and a lower mold 377 is disposed on the back surface 332b side of the lower layer lead frame 332. Then, in a state in which the upper mold 375 comes into contact with the top surface 332a side of the lower layer lead frame 332 without a gap by using the fluororesin sheet 58, a melted epoxy resin or the like is injected and filled into the half-etched region on the top surface 331a side of the lower layer lead frame 332 from the side thereof. In this way, the molded member 342 is formed (shaped).

Figure 20C:
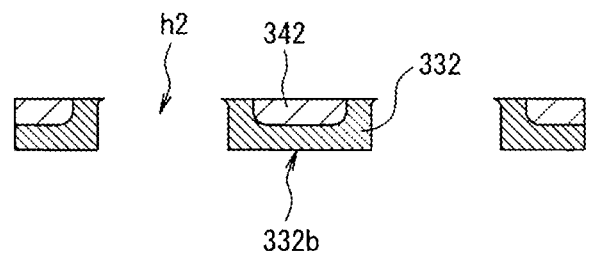
Figure 20D:
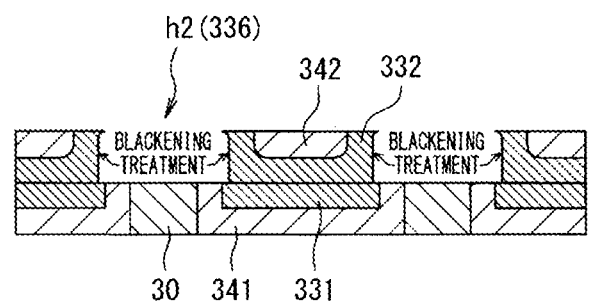

Next, as illustrated in FIG. 20C, the upper mold and the lower mold are removed, and then the pressure-sensitive adhesive sheet is removed from the back surface 332b side of the lower layer lead frame 332. After removing the pressure-sensitive adhesive sheet 51, post curing is performed. Wet blasting is also performed as needed. Then, as illustrated in FIG. 20D, the back surface side of the lower layer lead frame 332 in which the molded member 342 is formed and the back surface side of the upper layer lead frame 331 in which the molded member 341 is formed are joined (that is, laminated). For example, an adhesive (not illustrated) is used for this junction. Furthermore, before or after this junction, the inner side surface of the opening portion h2 is subjected to the blackening treatment.

It is to be noted that the arrangement of the optical filter 33 to the upper layer lead frame 331 and the forming method of the molded member 341 are similar to those described above by referring to FIGS. 19A to 19C. The infrared-sensor filter member 310 illustrated in FIGS. 17A, 17B, and 17D is completed through the steps described above.

Fourth Embodiment

In the first embodiment, a case in which the IR sensor element 43 includes the four light receiving regions 144a to 144d divided into upper, lower, right, and left regions, as illustrated in FIGS. 4A and 4B has been described. However, in the embodiments of the present disclosure, the number of chips and the structure of the IR sensor element are not limited thereto. For example, two IR sensor elements having a light receiving region that is not divided (that is, having one light receiving region) may be separately disposed from each other in the infrared sensor member, and the infrared-sensor filter members 210 described in the second embodiment may be disposed on the respective IR sensor elements.

(Configuration)

Figure 21A:
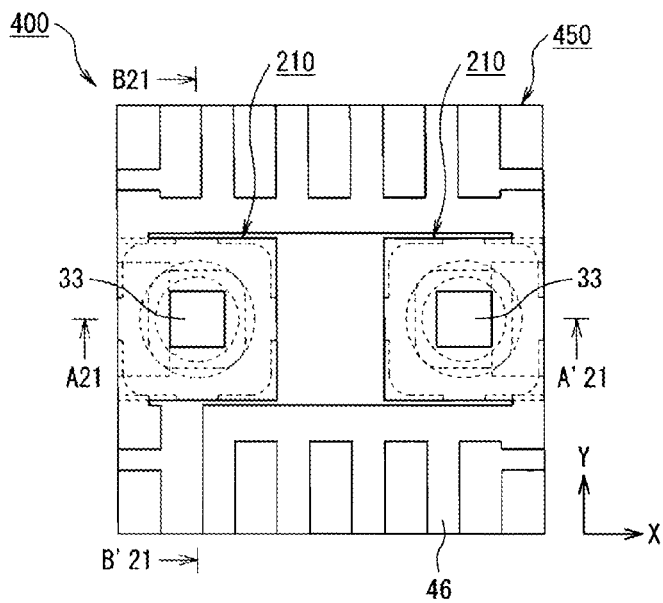
FIGS. 21A to 21D are views illustrative of a configuration example of an infrared sensor 400 according to the fourth embodiment.
Figure 21D:
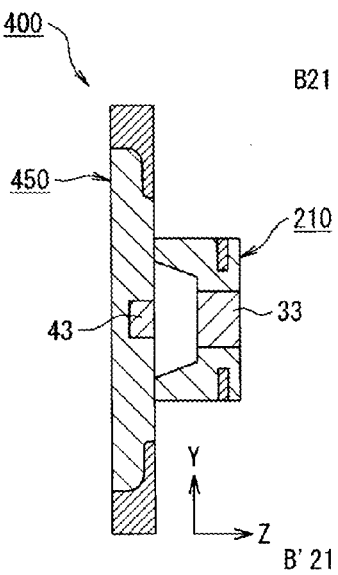
Figure 21B:
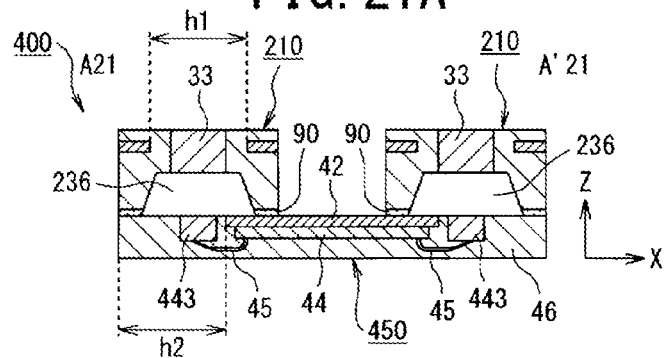
Figure 21C:
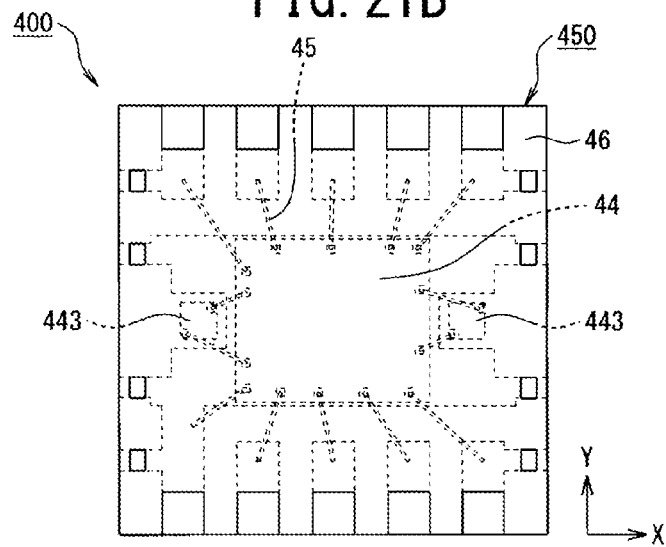

FIGS. 21A to 21D are views illustrative of a configuration example of an infrared sensor 400 according to the fourth embodiment of the present disclosure. Specifically, FIG. 21A is a plan view, FIG. 21B is a cross-sectional view taken along an A21-A'21 line (that is, a cross-sectional view parallel to the X-Z plane), FIG. 21C is a rear view, and FIG. 21D is a cross-sectional view taken along a B21-B'21 line (that is, a cross-sectional view parallel to the Y-Z plane).

As illustrated in FIGS. 21A to 21D, the infrared sensor 400 includes two infrared-sensor filter members 210 and an infrared sensor member 450, for example. The back surfaces of the infrared-sensor filter members 210 and the infrared sensor member 450 are adhered together, for example via the insulating paste 90.

The infrared sensor member 450 includes two IR sensor elements 443 disposed around the die pad 42. Herein, the IR sensor element 443 has a light receiving region that is not divided. That is, the sensor element has one light receiving region. The two IR sensor elements 443 are separately disposed from each other at the respective upper and lower positions (or right and left positions) in a plan view, for example, and the top surfaces (that is, surfaces opposite to the light receiving surfaces) and the side surfaces thereof are covered with the molded member 46. Furthermore, the back surfaces (that is, the light receiving surfaces) of the two IR sensor elements 443 are exposed from the molded member 46.

Furthermore, the infrared-sensor filter members 210 are disposed on the two respective IR sensor elements 443. In this way, the two IR sensor elements 443 faces a respective optical filter 33 via spaces in the recess portions 236 to be able to receive infrared rays passing through the respective optical filters 33.

Effects of Fourth Embodiment

According to the fourth embodiment of the present disclosure, the same effects as the effects (1), (2), and (4) to (7) of the first embodiment are exhibited.

Furthermore, the infrared sensor member 450 includes the two IR sensor elements 443. These two IR sensor elements 443 are separately disposed from each other at the respective upper and lower positions (or right and left positions) in a plan view, for example. Therefore it is possible to prevent the view angles of the IR sensor elements 443 from partially overlapping with each other.

(Modification)

The modifications (1) and (2) described in the first embodiment may be applied to the fourth embodiment of the present disclosure.

Fifth Embodiment

In the fourth embodiment, a case in which infrared-sensor filter members 210 are disposed on the two respective IR sensor elements, separately disposed from each other, has been described. However, these infrared-sensor filter members 210 may be integrated.

(Configuration)

Figure 22A:
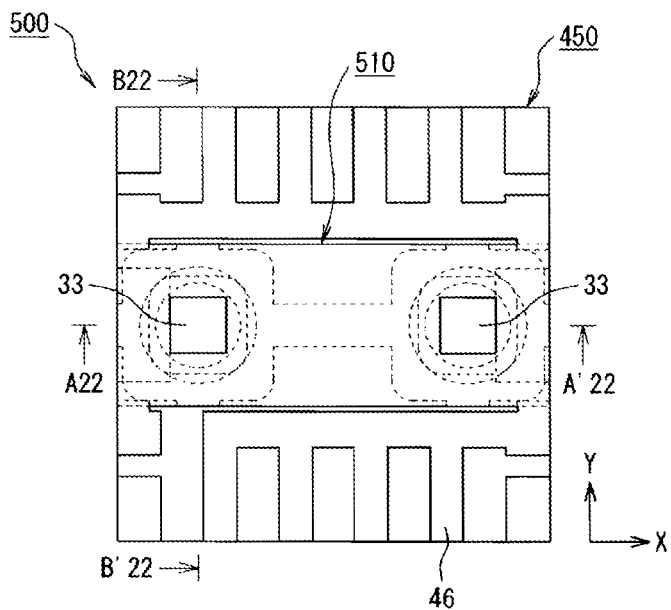
FIGS. 22A to 22D are views illustrative of a configuration example of an infrared sensor 500 according to the fifth embodiment.
Figure 22D:
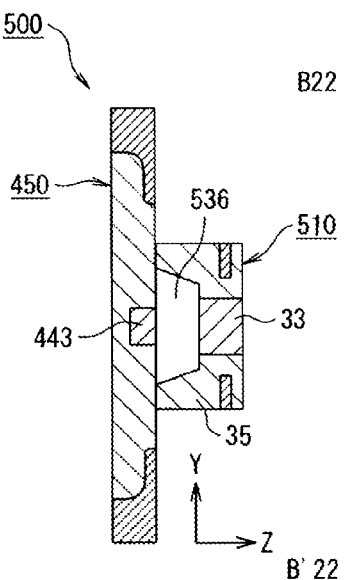
Figure 22B:
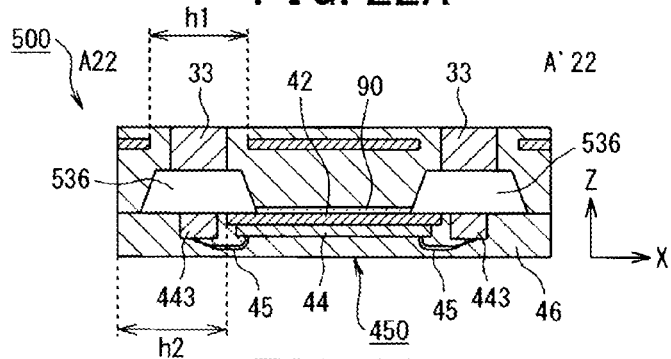
Figure 22C:
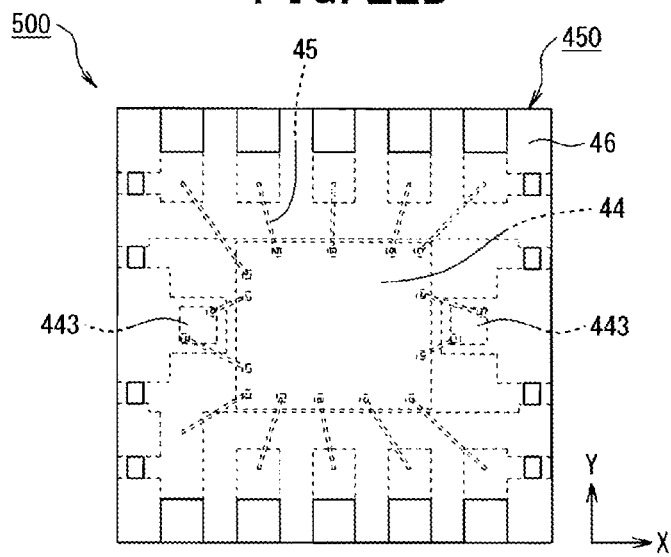

FIGS. 22A to 22D are views illustrative of a configuration example of an infrared sensor 500 according to the fifth embodiment of the present disclosure. Specifically, FIG. 22A is a plan view, FIG. 22B is a cross-sectional view taken along an A22-A'22 line (that is, a cross-sectional view parallel to the X-Z plane), FIG. 22C is a rear view, and FIG. 22D is a cross-sectional view taken along a B22-B'22 line (that is, a cross-sectional view parallel to the Y-Z plane).

As illustrated in FIGS. 22A to 22D, the infrared sensor 500 includes an infrared-sensor filter member 510 and an infrared sensor member 450, for example. The two infrared-sensor filter members 210 described in the fourth embodiment are integrated into the infrared-sensor filter member 510. The back surfaces of the infrared-sensor filter member 510 and the infrared sensor member 450 are adhered together, for example, via the insulating paste 90.

Recess portions 536 are disposed on the two respective IR sensor elements 443 and optical filters 33 are disposed on the two respective IR sensor elements 443. In this way, both IR sensor elements 443 face the respective optical filters 33 through spaces in the recess portions 536 to be able to receive infrared rays passing through the respective optical filters 33.

Effects of Fifth Embodiment

According to the third embodiment of the present disclosure, the same effects as the effects of the fourth embodiment are exhibited.

(Modification)

The modifications (1) and (2) described in the first embodiment may be applied to the fifth embodiment of the present disclosure.

Sixth Embodiment

In the fourth and the fifth embodiments, a case in which the two respective IR sensor elements 443 are separately disposed from each other has been described. However, in the embodiments of the present disclosure, the number of the IR sensor elements 443 is not limited to two.

(Configuration)

FIGS. 23A to 23D are illustrative views of a configuration example of an infrared sensor 600 according to the sixth embodiment of the present disclosure.

Figure 23A:
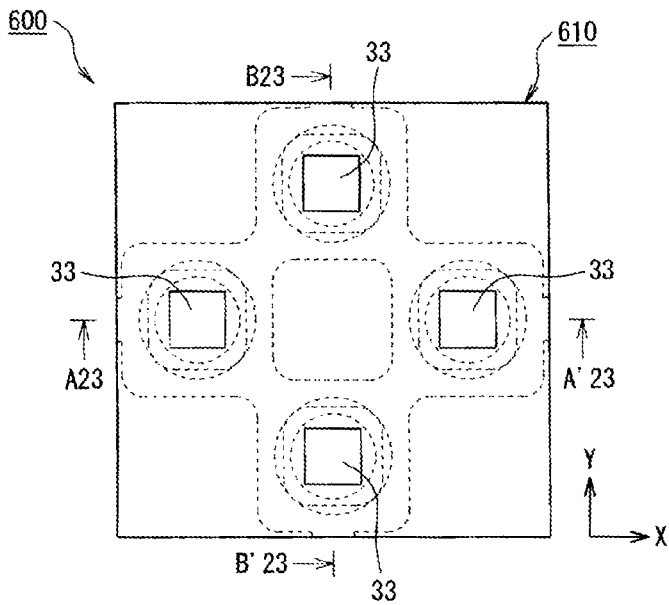
FIGS. 23A to 23D are views illustrative of a configuration example of an infrared sensor 600 according to the sixth embodiment.
Figure 23D:
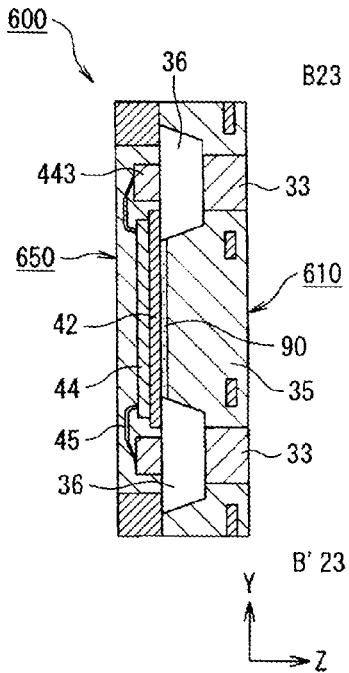
Figure 23B:
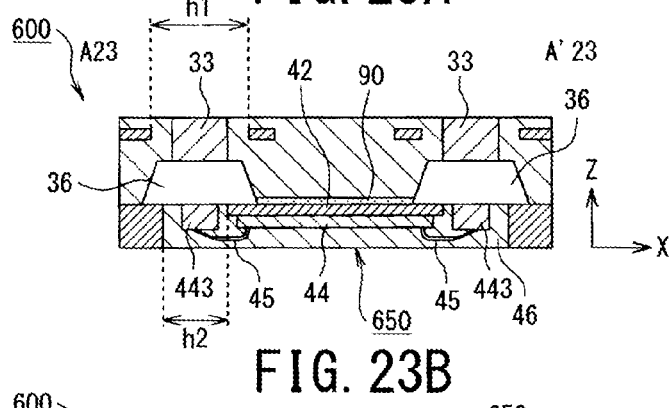
Figure 23C:
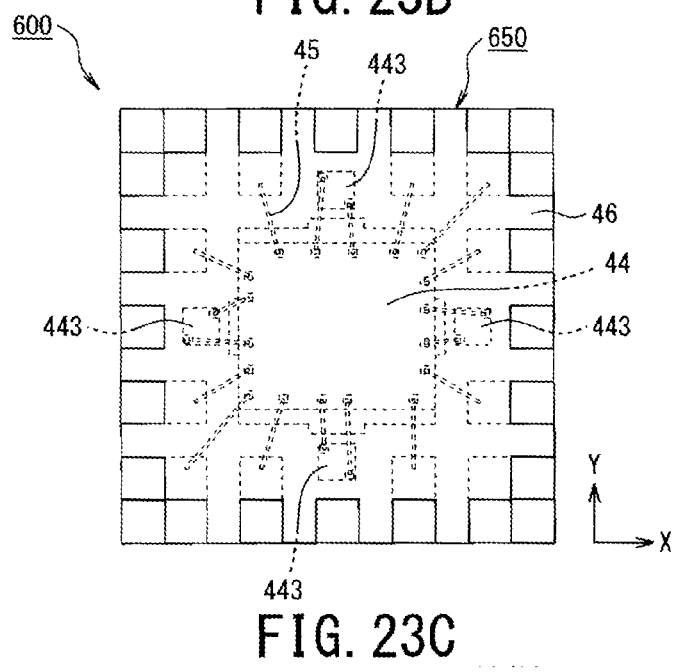

Specifically, FIG. 23A is a plan view, FIG. 23B is a cross-sectional view taken along an A23-A'23 line (that is, a cross-sectional view parallel to the X-Z plane), FIG. 23C is a rear view, and FIG. 23D is a cross-sectional view taken along a B23-B'23 line (that is, a cross-sectional view parallel to the Y-Z plane).

As illustrated in FIGS. 23A to 23D, the infrared sensor 600 includes an infrared-sensor filter member 610 and an infrared-sensor member 650, for example. The back surfaces of the infrared-sensor filter member 610 and the infrared-sensor member 650 are adhered together, for example via the insulating paste 90.

The infrared-sensor member 650 includes four IR sensor elements 443 disposed around the die pad 42. These four IR sensor elements 443 are separately disposed from one another at the respective upper, lower, right, and left positions in a plan view, and the top surfaces (that is, surfaces opposite to the light receiving surfaces) and the side surfaces thereof are covered with the molded member 46. Furthermore, the back surfaces (that is, the light receiving surfaces) of the four IR sensor elements 443 are exposed from the molded member 46.

The infrared-sensor filter member 610 includes four optical filters 33 separately disposed from one another at respective upper, lower, right, and left positions in a plan view. The side surfaces of each optical filters 33 is covered with the molded member 35, and the light-incident surfaces 33a and the light-exit surfaces 33b are exposed from the first member 35. Furthermore, the infrared-sensor filter member 610 is provided with four recess portions 36, having at least a part of bottom surface thereof formed by the light-exit surfaces 33b of the optical filter 33, and side walls thereof formed by the first member 35. In this way, the four IR sensor elements 443 faces respective optical filters 33 via spaces in the recess portions 36 to be able to receive infrared rays passing through the respective optical filters 33.

Effects of Sixth Embodiment

According to the sixth embodiment of the present disclosure, the same effects as the effects (1), (2), and (4) to (7) of the first embodiment are exhibited.

Furthermore, the infrared-sensor member 650 includes the four IR sensor elements 443. These four IR sensor elements 443 are separately disposed from one another at the respective upper, lower, right, and left positions in a plan view. Therefore, it is possible to prevent the view angles of the IR sensor elements 443 from partially overlapping with each other.

It is possible to make the infrared sensor 600 including the infrared-sensor member 650 and the infrared-sensor filter member 610 having a larger view angle than that of the infrared sensors 400 and 500 described above.

(Modification)

The modifications (1) and (2) described in the first embodiment may be applied to the sixth embodiment of the present disclosure.

(Regarding Method for Measuring Emissivity)

Examples of a method for measuring the emissivity includes a method in which a sample to be measured and a black body as a reference of the emissivity are prepared and the emissivity of the sample is measured by combining with the use of an FTIR equipment, which is an infrared spectrophotometer. The sample and the black body are heated at a certain temperature, for example 50° C. The doses of the infrared rays of heat radiation from the sample and the black body are measured by using the FTIR device. Then, the emissivity is calculated from the ratio of the dose of the infrared ray of the heat radiation from the sample relative to the dose of the infrared ray of the heat radiation from the black body. In detecting the doses of the infrared rays by the FTIR equipment, the areas where the heat radiation from the sample and the black body are measured should be made equal to each other by using an aperture or the like.

(Others)

The infrared sensors 100, 200, 300, 400, 500, and 600 described in the first to the sixth embodiments can be incorporated into various electronic equipment, and are preferably usable as, for example, an absence sensor configured to automatically set a monitor device to a non-display state when a user leaves a seat, to save electric power, and to automatically restore the monitor device to a display state when the user return to the seat.

According to one aspect of the present disclosure, an adhered region of the infrared-sensor filter member (that is, a surface coming into contact with the adhesive) and the optical filter are not on the same surface, and the optical filter is located at a position recessed relative to the adhered region. Therefore, it is possible to prevent the optical filter from being contaminated by the adhesive.

The invention is not limited to the above-described embodiments. It is possible to add modifications and the like in the design of an embodiment based on the knowledge of a person having ordinary skill in the technical field of the invention. Such embodiments with such modifications and the like are included in the scope of this invention.

REFERENCE SIGNS LIST 10, 210, 310, 510, 610 infrared-sensor filter member
10b back surface
11 adhered region
12 groove
31, 231 second member (lead frame)
41 third member (lead frame)
330 lead frame
31a, 41a, 231a, 330a, 331a, 332a top surface
31b, 41b, 231b, 331b, 332b back surface
33 optical filter
33a top surface (light-incident surface)
33b back surface (light-exit surface)
35 first member
46, 340, 341, 342 molded member 36, 236, 336 recess portion
36a, 336a inner side surface
42 die pad
42a surface to which signal processing IC is attached
43, 443 IR sensor element
43a top surface
43b back surface (light receiving surface)
44 signal processing IC
45 wire
50, 450, 650 infrared sensor member
51, 61 pressure-sensitive adhesive sheet
55, 65, 255, 355, 365, 375 upper mold
55a, 255a protrusion portion
57, 67, 257, 357, 367, 377 lower mold
58 fluororesin sheet
59 dicing tape
90 connecting member (insulating paste)
100, 200, 300, 400, 500, 600 infrared sensor
331 upper layer lead frame
332 lower layer lead frame (first member)
336b outer side surface
h1 opening portion
h1a opening portion
h1b opening portion
h2 opening portion

The invention claimed is:

1. An infrared-sensor filter member, comprising:
an optical filter for an infrared sensor; and
a recess portion formed by one surface of the optical filter and a first member, wherein
a bottom surface of the recess portion includes a center portion formed by one surface of the optical filter and a peripheral portion formed by the first member, and
side walls of the recess portion are formed by the first member.

2. The infrared-sensor filter member according to claim 1, wherein
an inner side surface of the side wall is inclined relative to the bottom surface such that an area of an opening surface of the recess portion is larger than an area of the bottom surface of the recess portion.

3. The infrared-sensor filter member according to claim 1, further comprising a second member with an emissivity equal to or smaller than 0.3, wherein
at least a part of the second member is exposed from an outer surface of the infrared-sensor filter member.

4. The infrared-sensor filter member according to claim 3, wherein
another surface of the optical filter is exposed from one of outer surfaces of the infrared-sensor filter member, and
at least the part of the second member is exposed from the one of the outer surfaces of the infrared-sensor filter member.

5. The infrared-sensor filter member according to claim 4, wherein at least the part of the second member is exposed from the outer surface of the infrared-sensor filter member so as to surround the other surface of the optical filter in a plan view.

6. The infrared-sensor filter member according to claim 3, wherein at least the part of the second member is exposed from an outer side surface of the infrared-sensor filter member.

7. The infrared-sensor filter member according to claim 1, wherein an emissivity of the first member is equal to or larger than 0.7.

8. The infrared-sensor filter member according to claim 1, wherein an emissivity of the first member is equal to or smaller than 0.3.

9. The infrared-sensor filter member according to claim 8, wherein an inner side surface of the side wall of the recess portion is subjected to blackening treatment.

10. An infrared sensor, comprising:
the infrared-sensor filter member according to claim 1;
an infrared sensor member including an infrared sensor element; and
a connecting member adopted to connect the infrared-sensor filter member and the infrared sensor member, wherein
the infrared-sensor filter member is disposed on the infrared sensor member such that the recess portion covers a light receiving surface of the infrared sensor element.

11. The infrared sensor according to claim 10, wherein the infrared sensor member further includes:
a third member with an emissivity equal to or smaller than 0.3; and
a molded member adopted to seal the infrared sensor element and the third member, and wherein
the infrared-sensor filter member is disposed on one of outer surfaces of the infrared sensor member, and
at least a part of the third member is exposed from the one of the outer surfaces of the infrared sensor member.

12. The infrared sensor according to claim 11, wherein at least the part of the third member is exposed from the one of the outer surfaces of the infrared sensor member in a region outside the infrared-sensor filter member in a plan view.

13. The infrared sensor according to claim 10, wherein
the light receiving surface of the infrared sensor element is exposed from one of the outer surfaces of the infrared sensor member, and
the light receiving surface of the infrared sensor element is surround by a member with an emissivity equal to or larger than 0.7 on the one of the outer surfaces of the infrared sensor member.

14. An infrared sensor, comprising:
an infrared-sensor filter member including an optical filter for an infrared sensor and a first member having sidewall and bottom surface zones;
an infrared sensor member including an infrared sensor element; and
a recess portion formed between the infrared-sensor filter member and the infrared sensor member, wherein:
side walls of the recess portion are defined by the first member sidewall zones,
at least a part of a top surface of the recess portion is defined by a light receiving surface of the infrared sensor element,
a center portion of a bottom surface of the recess portion is defined by the optical filter, and
a peripheral portion of the bottom surface is defined by the first member bottom surface zones.

* * * * *